(12) United States Patent  
Kobayashi

(10) Patent No.: US 7,746,172 B1
(45) Date of Patent: Jun. 29, 2010

(54) LINEARIZED DIFFERENTIAL TRANSIMPEDANCE AMPLIFIER

(75) Inventor: Kevin W. Kobayashi, Torrance, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 15 days.

(21) Appl. No.: 12/396,031

(22) Filed: Mar. 2, 2009

Related U.S. Application Data

(60) Provisional application No. 61/076,061, filed on Jun. 26, 2008.

(51) Int. Cl.
*H03F 3/45* (2006.01)

(52) U.S. Cl. ........................................ 330/260; 330/308
(58) Field of Classification Search .................. 330/59, 330/110, 308, 260; 250/214 A
See application file for complete search history.

(56) References Cited

U.S. PATENT DOCUMENTS 6,552,605 B1 *   4/2003   Yoon ............................. 330/9

* cited by examiner

*Primary Examiner*—Robert Pascal
*Assistant Examiner*—Hieu P Nguyen
(74) *Attorney, Agent, or Firm*—Withrow & Terranova, PLLC

(57) ABSTRACT

The present invention relates to a transimpedance amplifier circuit that includes a linearized differential transimpedance amplifier, a detector, and dynamic current source circuitry, which diverts common mode currents from feedback resistors in the linearized differential transimpedance amplifier to keep the linearized differential transimpedance amplifier in a linear operating range. Magnitudes of the diverted common mode currents from the feedback resistors may be based on a detected magnitude associated with differential input signals that feed the linearized differential transimpedance amplifier. The detector provides a detector output signal to the dynamic current source circuitry based on the detected magnitude associated with the differential input signals, such that the diverted common mode currents are based on the detector output signal. The transimpedance amplifier circuit provides differential output signals that are based on amplifying the differential input signals.

20 Claims, 21 Drawing Sheets

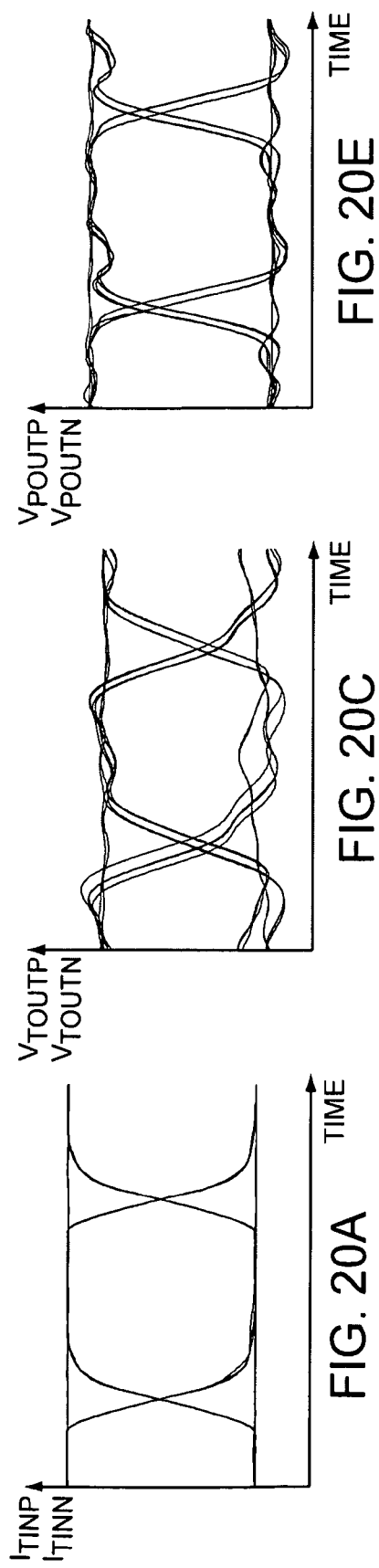
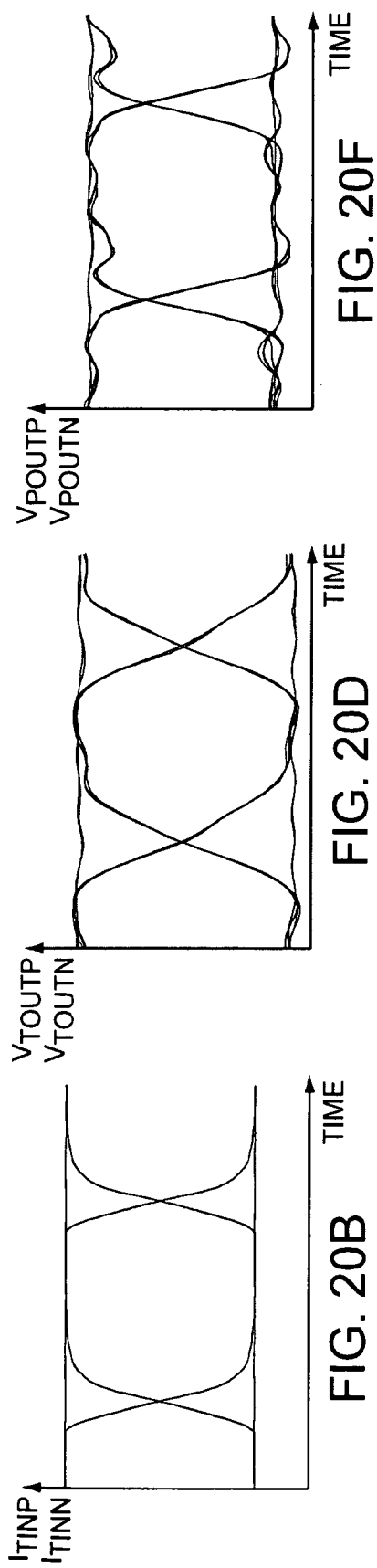

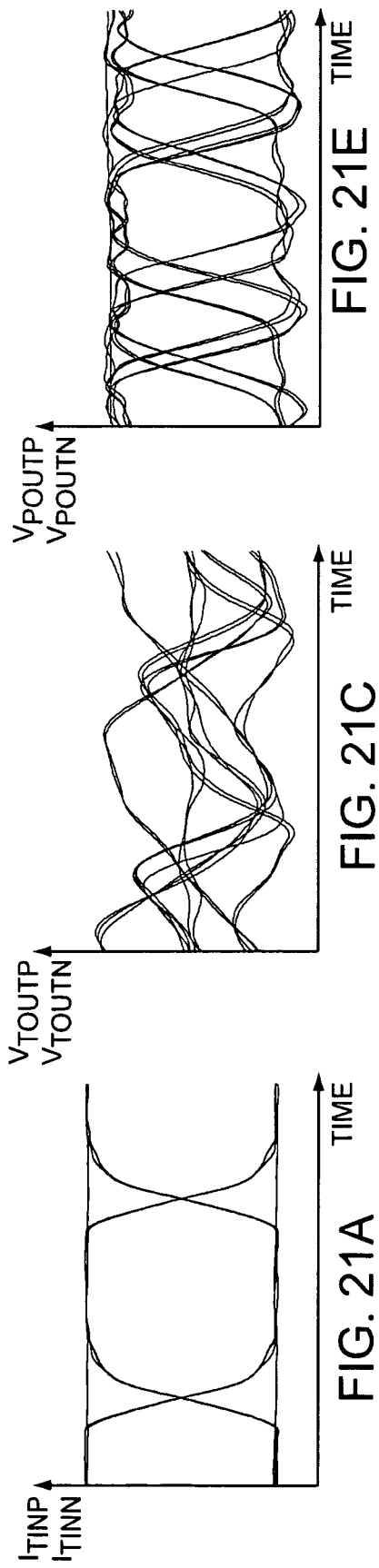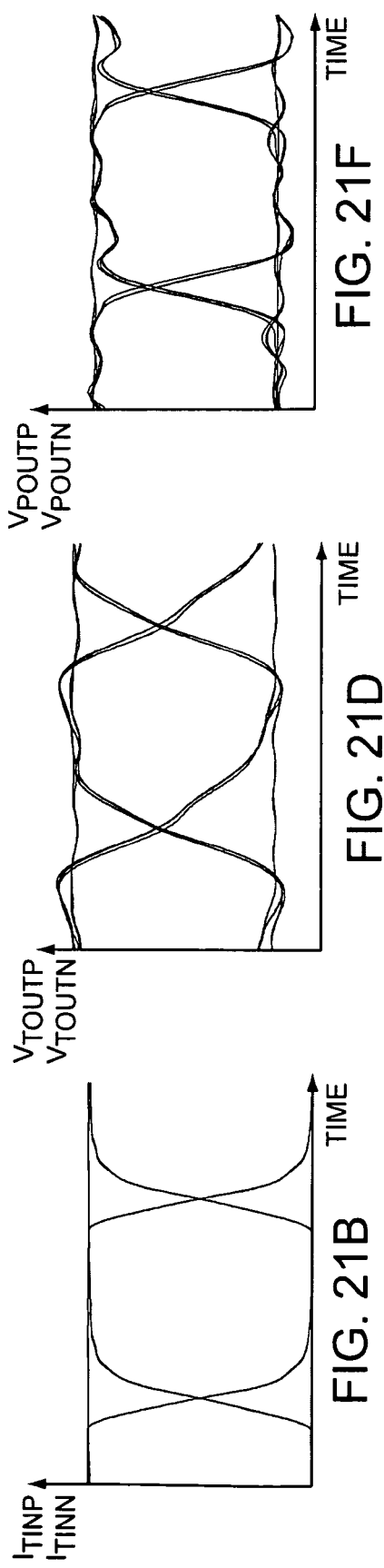

US 7,746,172 B1

LINEARIZED DIFFERENTIAL TRANSIMPEDANCE AMPLIFIER

This application claims the benefit of provisional patent application Ser. No. 61/076,061, filed Jun. 26, 2008, the disclosure of which is hereby incorporated herein by reference in its entirety.

FIELD OF THE INVENTION

Embodiments of the present invention relate to differential transimpedance amplifiers, which may be used in fiber-optics based communications systems.

BACKGROUND OF THE INVENTION

A differential transimpedance amplifier is commonly used to convert a differential input current to a differential output voltage. For example, in a fiber-optics based communications system, photo-diodes in an optical receiver may provide differential output currents based on received optical data. A differential transimpedance amplifier may be coupled to the photo-diodes to convert the differential output currents into differential output voltages. As fiber-optics based communications standards evolve, reach requirements will increase, which will require optical receivers with increased effective sensitivity. Therefore, differential transimpedance amplifiers will be needed with improved noise performance, increased dynamic range, and improved linearity.

Presently, digital limiting differential transimpedance amplifiers are used with 40 Gigabit per second and 100 Gigabit per second optical receivers to support differential phase shift keying (DPSK) and differential quadrature phase shift keying (DQPSK) modulation methods. However, such amplifiers typically have 50 ohm input resistors, which may introduce unacceptable levels of noise in future systems. FIG. 1 shows a differential limiting amplifier 10 according to the prior art. The differential limiting amplifier 10 includes a first input transistor element QI1, a second input transistor element QI2, a first output transistor element QO1, a second output transistor element QO2, a first resistive element R1 coupled between a base of the first input transistor element QI1 and a DC supply bus, a second resistive element R2 coupled between a base of the second input transistor element QI2 and the DC supply bus, a third resistive element R3 coupled between a collector of the first output transistor element QO1 and the DC supply bus, a fourth resistive element R4 coupled between a collector of the second output transistor element QO2 and the DC supply bus, a first current source 12 coupled between an emitter of the first input transistor element QI1 and ground, a second current source 14 coupled between an emitter of the second input transistor element QI2 and ground, and a third current source 16 coupled between an emitter of the first output transistor element QO1 and ground.

The emitter of the first input transistor element QI1 is coupled to a base of the first output transistor element QO1 and the emitter of the second input transistor element QI2 is coupled to a base of the second output transistor element QO2. The emitter of the first output transistor element QO1 is coupled to an emitter of the second output transistor element QO2. Collectors of the first and second input transistor elements QI1, QI2 are coupled to the DC supply bus. A positive-side input signal $V_{INP}$ feeds the base of the first input transistor element QI1 and a negative-side input signal $V_{INN}$ feeds the base of the second input transistor element QI2. The positive-side and negative-side input signals $V_{INP}$, $V_{INN}$ are normally phase-shifted about 180 degrees from one another and form a differential input signal. The collector of the first output transistor element QO1 provides a positive-side output signal $V_{OUTP}$ and the collector of the second output transistor element QO2 provides a negative-side output signal $V_{OUTN}$. The positive-side and negative-side output signals $V_{OUTP}$, $V_{OUTN}$ are normally phase-shifted about 180 degrees from one another and form a differential output signal. A DC supply signal $V_{DCSUP}$ feeds the DC supply bus.

The first and second input transistor elements QI1, QI2 operate as emitter followers that provide voltages at their respective emitters based on voltages at their respective bases. The first and second output transistor elements QO1, QO2, the third and fourth resistive elements R3, R4, and the third current source 16 form a differential amplifier. The bases of the first and second output transistor elements QO1, QO2 are inputs to the differential amplifier; therefore, the emitter voltages of the first and second input transistor elements QI1, QI2 feed the inputs to the differential amplifier. The collectors of the first and second output transistor elements QO1, QO2 are outputs from the differential amplifier that provide the positive-side and negative-side output signals $V_{OUTP}$, $V_{OUTN}$, respectively. Since the differential amplifier tends to amplify differential signals and not amplify common mode signals, a voltage difference between the positive-side and negative-side output signals $V_{OUTP}$, $V_{OUTN}$ is based on a voltage difference between the positive-side and negative-side input signals $V_{INP}$, $V_{INN}$.

The differential limiting amplifier 10 may be used as a transimpedance amplifier by converting input currents associated with the positive-side and negative-side input signals $V_{INP}$, $V_{INN}$ into input voltages by routing most of the input currents into the first and second resistive elements R1, R2. The resulting voltage drop across the first and second resistive elements R1, R2 provides the input voltages. The first and second resistive elements R1, R2 are sized to provide appropriate conversion values. For example, in one application, a value of each of the first and second resistive elements R1, R2 is equal to about 50 ohms, which may be noisy. Since a differential limiting amplifier 10 may be noisy, a differential transimpedance amplifier used as a pre-amplifier stage may reduce noise.

FIG. 2 shows a differential transimpedance amplifier 18 according to the prior art. The differential transimpedance amplifier 18 includes the first input transistor element QI1, the second input transistor element QI2, a first feedback transistor element QF1, a second feedback transistor element QF2, the first resistive element R1 coupled between the collector of the first input transistor element QI1 and a DC supply bus, the second resistive element R2 coupled between the collector of the second input transistor element QI2 and the DC supply bus, the third resistive element R3 coupled between an emitter of the first feedback transistor element QF1 and ground, the fourth resistive element R4 coupled between an emitter of the second feedback transistor element QF2 and ground, the first current source 12 coupled between the emitter of the first input transistor element QI1 and ground, a first feedback resistive element RF1 coupled between the emitter of the first feedback transistor element QF1 and the base of the first input transistor element QI1, and a second feedback resistive element RF2 coupled between the emitter of the second feedback transistor element QF2 and the base of the second input transistor element QI2.

The collector of the first input transistor element QI1 is coupled to a base of the first feedback transistor element QF1 and the collector of the second input transistor element QI2 is coupled to a base of the second feedback transistor element QF2. The emitter of the first input transistor element QI1 is coupled to the emitter of the second input transistor element QI2. Collectors of the first and second feedback transistor elements QF1, QF2 are coupled to the DC supply bus. A positive-side transimpedance input signal $V_{TINP}$ feeds the base of the first input transistor element QI1 and a negative-side transimpedance input signal $V_{TINN}$ feeds the base of the second input transistor element QI2. The positive-side and negative-side transimpedance input signals $V_{TINP}$, $V_{TINN}$ are normally phase-shifted about 180 degrees from one another and form a differential input signal. The collector of the first input transistor element QI1 provides a positive-side transimpedance output signal $V_{TOUTP}$ and the collector of the second input transistor element QI2 provides a negative-side transimpedance output signal $V_{TOUTN}$. The positive-side and negative-side transimpedance output signals $V_{TOUTP}$, $V_{TOUTN}$ are normally phase-shifted about 180 degrees from one another and form a differential output signal. The DC supply signal $V_{DCSUP}$ feeds the DC supply bus.

The first and second input transistor elements QI1, QI2, the first and second resistive elements R1, R2, and the first current source 12 form a differential amplifier. The bases of the first and second input transistor elements QI1, QI2 are inputs to the differential amplifier, and the collectors of the first and second input transistor elements QI1, QI2 are outputs from the differential amplifier. The first and second feedback transistor elements QF1, QF2, the third and fourth resistive elements R3, R4, and the first and second feedback resistive elements RF1, RF2 form a feedback circuit that provides feedback from the outputs of the differential amplifier back to the inputs of the differential amplifier. Therefore, the differential transimpedance amplifier 18 may operate as a differential amplifier with differential feedback.

Since the differential transimpedance amplifier 18 is a transimpedance amplifier, which is commonly used to convert a differential input current to a differential output voltage, the positive-side and negative-side transimpedance input signals $V_{TINP}$, $V_{TINN}$ are normally associated with positive-side and negative-side transimpedance input currents $I_{TINP}$, $I_{TINN}$, respectively. Most of the positive-side and negative-side transimpedance input currents $I_{TINP}$, $I_{TINN}$ may flow through the first and second feedback resistive elements RF1, RF2, respectively. The first and second feedback resistive elements RF1, RF2 have positive-side and negative-side feedback currents $I_{FP}$, $I_{FN}$, respectively, which may be slightly less than the positive-side and negative-side transimpedance input currents $I_{TINP}$, $I_{TINN}$. The positive-side and negative-side feedback currents $I_{FP}$, $I_{FN}$ and currents from the emitters of the first and second feedback transistor elements QF1, QF2 combine to feed the third and fourth resistive elements R3, R4, respectively, which have third and fourth resistive currents $I_{R3}$, $I_{R4}$, respectively. Most of the positive-side transimpedance input current $I_{TINP}$, all of the positive-side feedback current $I_{FP}$, and a portion of the third resistive current $I_{R3}$ may follow a positive-side current path $I_{PATHP}$. Similarly, most of the negative-side transimpedance input current $I_{TINN}$, all of the negative-side feedback current $I_{FN}$, and a portion of the fourth resistive current $I_{R4}$ may follow a negative-side current path $I_{PATHN}$.

Since the differential transimpedance amplifier 18 may operate as a differential amplifier with differential feedback, a voltage difference between the positive-side and negative-side transimpedance output signals $V_{TOUTP}$, $V_{TOUTN}$ may be based on a current difference between the positive-side and negative-side transimpedance input currents $I_{TINP}$, $I_{TINN}$.

Use of the differential transimpedance amplifier 18 as a pre-amplifier stage may reduce noise compared to a differential limiting amplifier 10, but may be at the expense of linearity and dynamic range. Future optical communications systems may require linear operation to support advanced features, such as coherent detection and digital signal processing, which may be associated with electronic dispersion compensation (EDC). Thus, there is a need for a differential transimpedance amplifier which may be used as a pre-amplifier stage, is linear, has wide dynamic range, and has low noise.

SUMMARY OF THE EMBODIMENTS

The present invention relates to a transimpedance amplifier circuit that includes a linearized differential transimpedance amplifier, a detector, and dynamic current source circuitry, which diverts common mode currents from feedback resistors in the linearized differential transimpedance amplifier to keep the linearized differential transimpedance amplifier in a linear operating range. Magnitudes of the diverted common mode currents from the feedback resistors may be based on a detected magnitude associated with differential input signals that feed the linearized differential transimpedance amplifier. The detector provides a detector output signal to the dynamic current source circuitry based on the detected magnitude associated with the differential input signals, such that the diverted common mode currents are based on the detector output signal. The transimpedance amplifier circuit provides differential output signals that are based on amplifying the differential input signals.

The feedback resistors have both input ends and output ends. The diverted common mode currents may be taken from the input ends, the output ends, or both. When a common mode magnitude of the differential input signals is large, such as in an optical overload power condition, the detected magnitude associated with the differential input signals is large. Therefore, the diverted common mode currents are large and may keep the voltage across the feedback resistors in a linear operating region. Likewise, as the common mode magnitude diminishes, the dynamic current source circuitry may be dynamically reconfigured to reduce the diverted common mode currents and keep the voltage across the feedback resistors in the linear operating region by preserving adequate operating headroom and providing sufficient voltage for adequate sensitivity.

In some embodiments of the present invention, the diverted common mode currents are taken from both the input ends and the output ends of the feedback resistors. The diverted common mode currents taken from the input ends may be dynamically controlled separately from the diverted common mode currents taken from the output ends to trade-off certain characteristics at different common mode magnitudes of the differential input signals. In general, diverted common mode currents taken from the input ends preserve operating headroom, but at the expense of reduced sensitivity and increased input noise. Diverted common mode currents taken from the output ends preserve operating headroom up to point, with less reduced sensitivity and less increased input noise compared to diverted common mode currents taken from the input ends.

For example, when the common mode magnitude of the differential input signals is small, diverted common mode currents taken from both the input ends and the output ends may be very small, or zero, for maximum sensitivity. As the common mode magnitude of the differential input signals increases, the diverted common mode currents taken from the output ends may increase and the diverted common mode currents taken from the input ends may remain very small, or zero, to preserve sensitivity and minimize shot noise associated with the diverted common mode currents taken from the input ends. As the common mode magnitude of the differential input signals becomes sufficiently large, the diverted common mode currents taken from both the output ends and the input ends may increase to preserve adequate operating headroom, while maintaining adequate sensitivity and keeping shot noise sufficiently small.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 19:
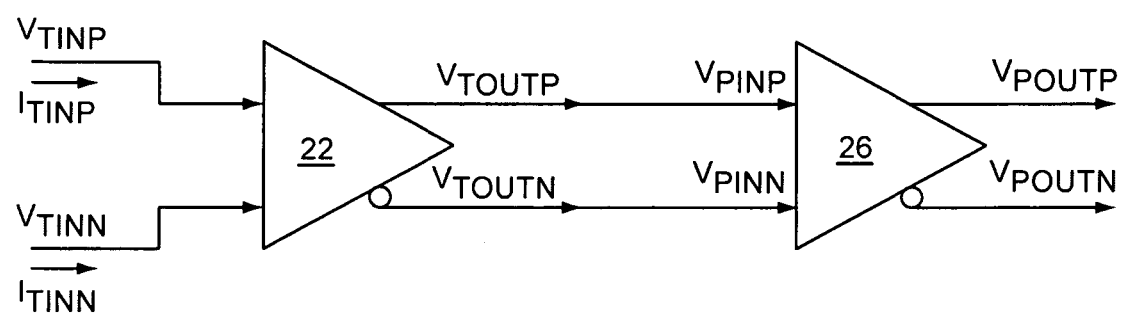
FIG. 19 is a simulation schematic showing the linearized differential transimpedance amplifier and the differential post amplifier.

FIGS. 20A, 20B, 20C, 20D, 20E, and 20F are graphs showing eye diagrams associated with the linearized differential transimpedance amplifier operating with and without linearization, and the differential post amplifier illustrated in FIG. 19.

FIGS. 21A, 21B, 21C, 21D, 21E, and 21F are graphs showing eye diagrams associated with the linearized differential transimpedance amplifier operating with and without linearization, and the differential post amplifier illustrated in FIG. 19.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a transimpedance amplifier circuit that includes a linearized differential transimpedance amplifier, a detector, and dynamic current source circuitry, which diverts common mode currents from feedback resistors in the linearized differential transimpedance amplifier to keep the linearized differential transimpedance amplifier in a linear operating range. Magnitudes of the diverted common mode currents from the feedback resistors may be based on a detected magnitude associated with differential input signals that feed the linearized differential transimpedance amplifier. The detector provides a detector output signal to the dynamic current source circuitry based on the detected magnitude associated with the differential input signals, such that the diverted common mode currents are based on the detector output signal. The transimpedance amplifier circuit provides differential output signals that are based on amplifying the differential input signals.

The feedback resistors have both input ends and output ends. The diverted common mode currents may be taken from the input ends, the output ends, or both. When a common mode magnitude of the differential input signals is large, such as in an optical overload power condition, the detected magnitude associated with the differential input signals is large. Therefore, the diverted common mode currents are large and may keep the voltage across the feedback resistors in a linear operating region. Likewise, as the common mode magnitude diminishes, the dynamic current source circuitry may be dynamically reconfigured to reduce the diverted common mode currents and keep the voltage across the feedback resistors in the linear operating region by preserving adequate operating headroom and providing sufficient voltage for adequate sensitivity.

In some embodiments of the present invention, the diverted common mode currents are taken from both the input ends and the output ends of the feedback resistors. The diverted common mode currents taken from the input ends may be dynamically controlled separately from the diverted common mode currents taken from the output ends to trade-off certain characteristics at different common mode magnitudes of the differential input signals. In general, diverted common mode currents taken from the input ends preserve operating headroom, but at the expense of reduced sensitivity and increased input noise. Diverted common mode currents taken from the output ends preserve operating headroom up to point, with less reduced sensitivity and less increased input noise compared to diverted common mode currents taken from the input ends.

For example, when the common mode magnitude of the differential input signals is small, diverted common mode currents taken from both the input ends and the output ends may be very small, or zero, for maximum sensitivity. As the common mode magnitude of the differential input signals increases, the diverted common mode currents taken from the output ends may increase and the diverted common mode currents taken from the input ends may remain very small, or zero, to preserve sensitivity and minimize shot noise associated with the diverted common mode currents taken from the input ends. As the common mode magnitude of the differential input signals becomes sufficiently large, the diverted common mode currents taken from both the output ends and the input ends may increase to preserve adequate operating headroom, while maintaining adequate sensitivity and keeping shot noise sufficiently small.

Figure 1:
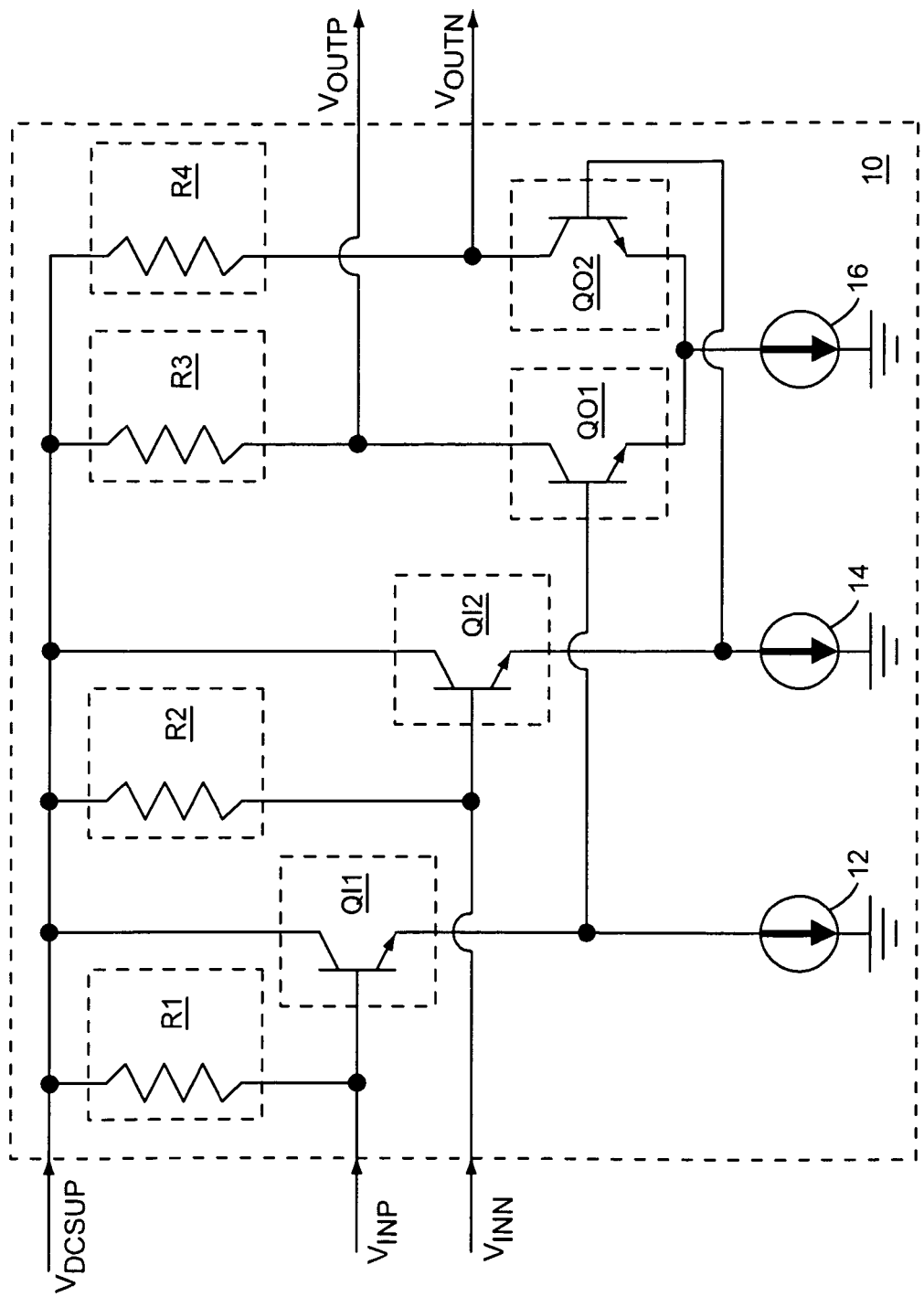
FIG. 1 shows a differential limiting amplifier according to the prior art.
Figure 2:
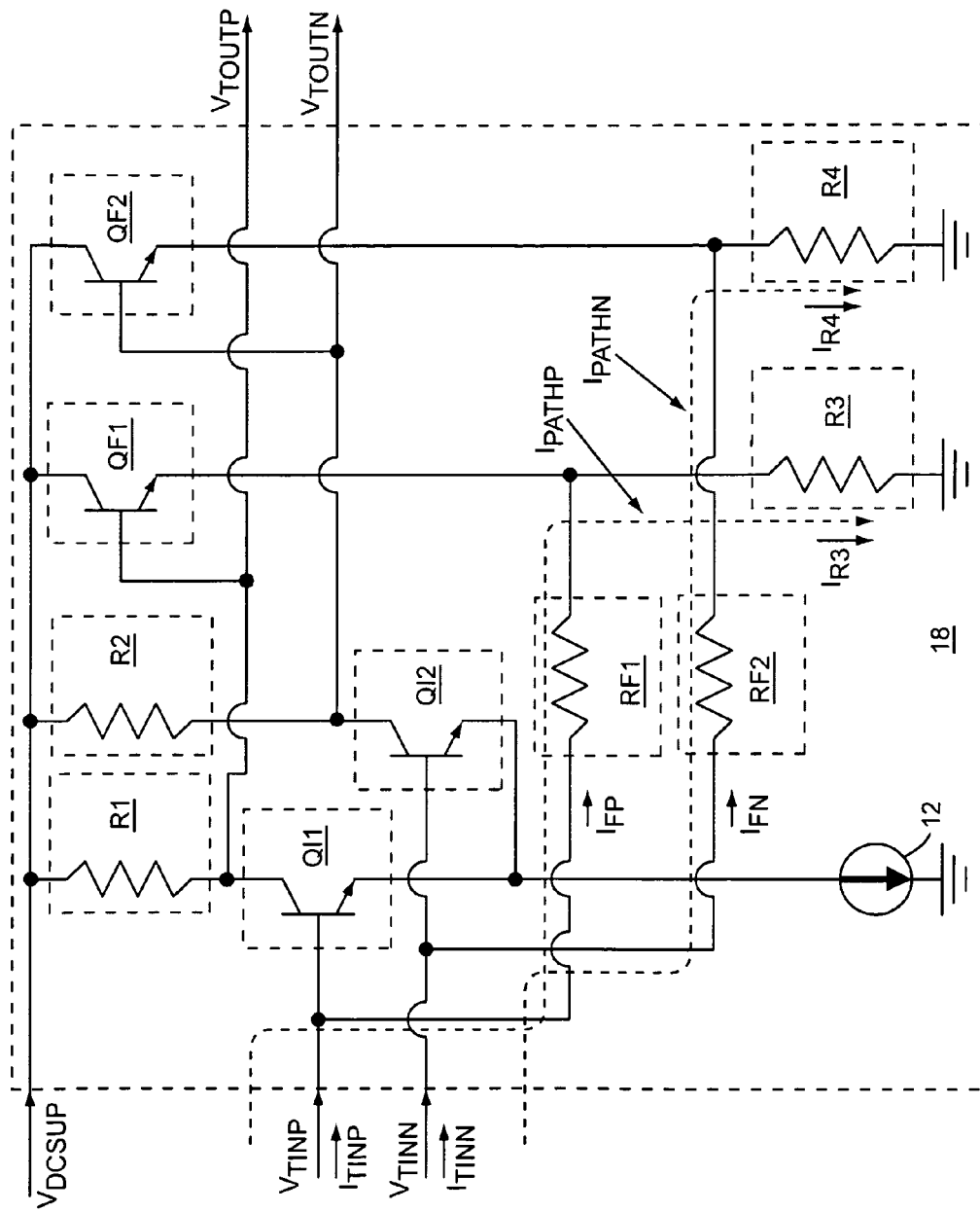
FIG. 2 shows a differential transimpedance amplifier according to the prior art.
Figure 3:
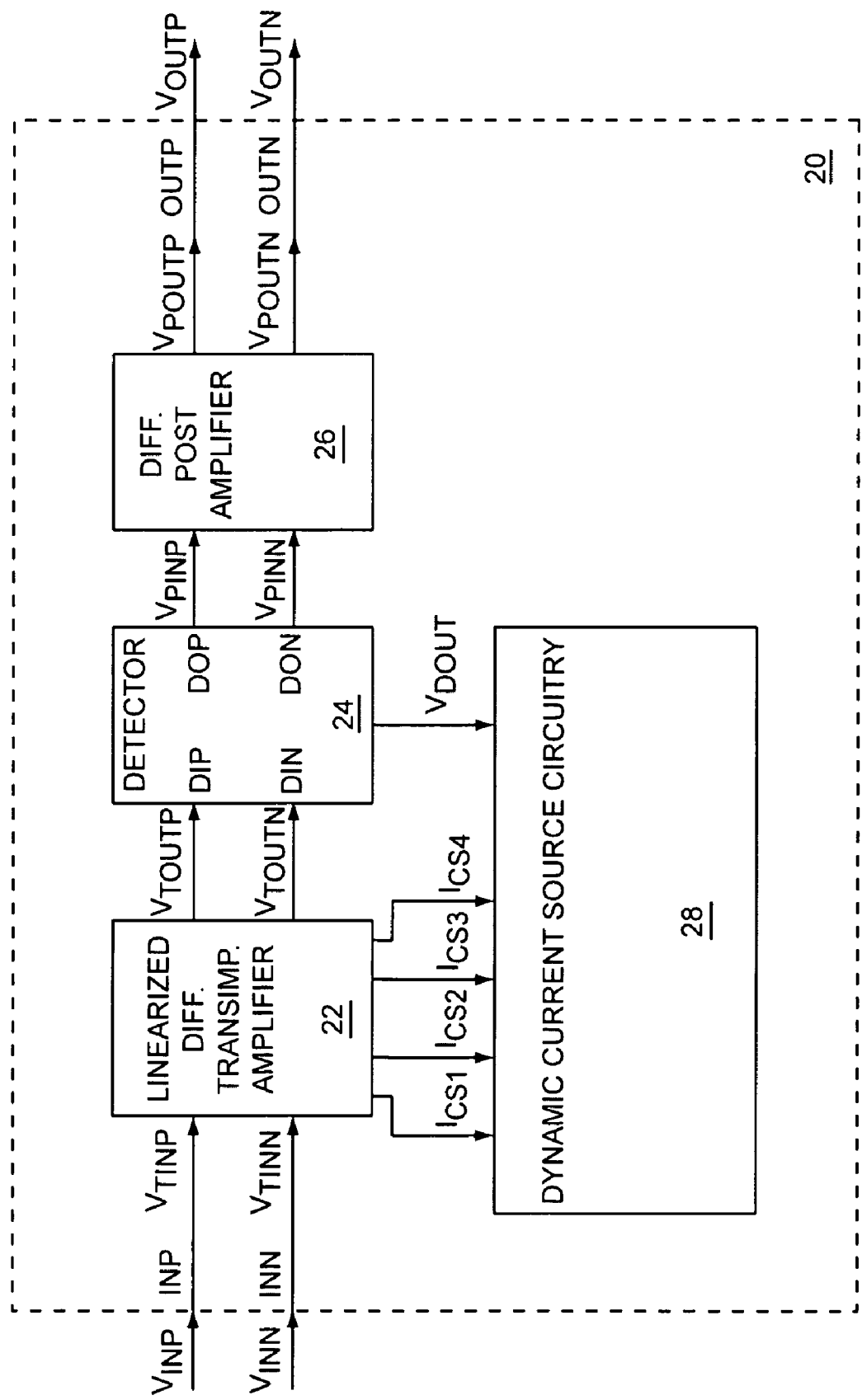
FIG. 3 shows a transimpedance amplifier circuit according to one embodiment of the present invention.

FIG. 3 shows a transimpedance amplifier circuit 20 according to one embodiment of the present invention. The transimpedance amplifier circuit 20 includes a linearized differential transimpedance amplifier 22, a detector 24, a differential post amplifier 26, dynamic current source circuitry 28, a positive-side input INP, a negative-side input INN, a positive-side output OUTP, and a negative-side output OUTN. A positive-side input signal $V_{INP}$ feeds the positive-side input INP, which provides the positive-side transimpedance input signal $V_{TINP}$ to the linearized differential transimpedance amplifier 22, and a negative-side input signal $V_{INN}$ feeds the negative-side input INN, which provides the negative-side transimpedance input signal $V_{TINN}$ to the linearized differential transimpedance amplifier 22. The positive-side and negative-side input signals $V_{INP}$, $V_{INN}$ may be phase-shifted about 180 degrees from one another and form a differential input signal.

The linearized differential transimpedance amplifier 22 provides the positive-side and negative-side transimpedance output signals $V_{TOUTP}$, $V_{TOUTN}$ to a positive-side detector input DIP and a negative-side detector input DIN, respectively, of the detector 24 based on amplifying the positive-side and negative-side transimpedance input signals $V_{TINP}$, $V_{TINN}$. The linearized differential transimpedance amplifier 22 may function as a pre-amplifier. Ideally, the detector 24 passes signals from the positive-side and negative-side detector inputs DIP, DIN to positive-side and negative-side detector outputs DOP, DON, respectively, without altering the passed signals in any way. However, a practical detector 24 may affect the passed signals somewhat. The detector 24 provides a detector output signal $V_{DOUT}$ to the dynamic current source circuitry 28 based on magnitudes of the positive-side and negative-side transimpedance output signals $V_{TOUTP}$, $V_{TOUTN}$, which may be indicative of magnitudes of the positive-side and negative-side input signals $V_{INP}$, $V_{INN}$.

The positive-side and negative-side detector outputs DOP, DON provide positive-side and negative-side post amplifier input signals $V_{PINP}$, $V_{PINN}$, respectively, to the differential post amplifier 26, which provides positive-side and negative-side post amplifier output signals $V_{POUTP}$, $V_{POUTN}$ to the positive-side output OUTP and the negative-side output OUTN, respectively, based on amplifying the positive-side and negative-side post amplifier input signals $V_{PINP}$, $V_{PINN}$. The positive-side and negative-side outputs OUTP, OUTN provide positive-side and negative-side output signals $V_{OUTP}$, $V_{OUTN}$, respectively.

The dynamic current source circuitry 28 receives diversion currents from both ends of feedback resistors (not shown) in the linearized differential transimpedance amplifier 22. The diversion currents include a first current source current $I_{CS1}$, a second current source current $I_{CS2}$, a third current source current $I_{CS3}$, and a fourth current source current $I_{CS4}$. Magnitudes of the first, second, third, and fourth current source currents $I_{CS1}$, $I_{CS2}$, $I_{CS3}$, $I_{CS4}$ are based on the detector output signal $V_{DOUT}$. The magnitudes of the first, second, third, and fourth current source currents $I_{CS1}$, $I_{CS2}$, $I_{CS3}$, $I_{CS4}$ may be controlled by the dynamic current source circuitry 28 and may be about equal to one another. The magnitudes of the first and second current source currents $I_{CS1}$, $I_{CS2}$ may be about equal to one another and the magnitudes of the third and fourth current source currents $I_{CS3}$, $I_{CS4}$ may be about equal to one another; however, the magnitudes of the first and second current source currents $I_{CS1}$, $I_{CS2}$ may be different from the magnitudes of the third and fourth current source currents $I_{CS3}$, $I_{CS4}$.

A magnitude of the detector output signal $V_{DOUT}$ may be directly related to the magnitudes of the positive-side and negative-side input signals $V_{INP}$, $V_{INN}$, such that as the magnitudes of the positive-side and negative-side input signals $V_{INP}$, $V_{INN}$ increase, the magnitude of the detector output signal $V_{DOUT}$ increases, and as the magnitudes of the positive-side and negative-side input signals $V_{INP}$, $V_{INN}$ decrease, the magnitude of the detector output signal $V_{DOUT}$ decreases. The magnitude of the detector output signal $V_{DOUT}$ may or may not be proportional to the magnitudes of the positive-side and negative-side input signals $V_{INP}$, $V_{INN}$.

Since the first, second, third, and fourth current source currents $I_{CS1}$, $I_{CS2}$, $I_{CS3}$, $I_{CS4}$ are based on the detector output signal $V_{DOUT}$, the magnitudes of any or all of the first, second, third, and fourth current source currents $I_{CS1}$, $I_{CS2}$, $I_{CS3}$, $I_{CS4}$ may be directly related to the magnitudes of the positive-side and negative-side input signals $V_{INP}$, $V_{INN}$, such that as the magnitudes of the positive-side and negative-side input signals $V_{INP}$, $V_{INN}$ increase, the magnitudes of any or all of the first, second, third, and fourth current source currents $I_{CS1}$, $I_{CS2}$, $I_{CS3}$, $I_{CS4}$ may increase, and as the magnitudes of the positive-side and negative-side input signals $V_{INP}$, $V_{INN}$ decrease, the magnitudes of any or all of the first, second, third, and fourth current source currents $I_{CS1}$, $I_{CS2}$, $I_{CS3}$, $I_{CS4}$ may decrease. Any or all of the first, second, third, and fourth current source currents $I_{CS1}$, $I_{CS2}$, $I_{CS3}$, $I_{CS4}$ may or may not be proportional to the magnitudes of the positive-side and negative-side input signals $V_{INP}$, $V_{INN}$.

The magnitude of the detector output signal $V_{DOUT}$ may be directly related to a common mode magnitude of the positive-side and negative-side input signals $V_{INP}$, $V_{INN}$, such that as the common mode magnitude of the positive-side and negative-side input signals $V_{INP}$, $V_{INN}$ increases, the magnitude of the detector output signal $V_{DOUT}$ increases, and as the common mode magnitude of the positive-side and negative-side input signals $V_{INP}$, $V_{INN}$ decreases, the magnitude of the detector output signal $V_{DOUT}$ decreases. The magnitude of the detector output signal $V_{DOUT}$ may or may not be proportional to the common mode magnitude of the positive-side and negative-side input signals $V_{INP}$, $V_{INN}$. The common mode magnitude of the positive-side and negative-side input signals $V_{INP}$, $V_{INN}$ is the portion of the magnitude of the positive-side input signal $V_{INP}$ that is common with the magnitude of the negative-side input signal $V_{INN}$.

Since the first, second, third, and fourth current source currents $I_{CS1}, I_{CS2}, I_{CS3}, I_{CS4}$ are based on the detector output signal $V_{DOUT}$, the magnitudes of any or all of the first, second, third, and fourth current source currents $I_{CS1}, I_{CS2}, I_{CS3}, I_{CS4}$ may be directly related to the common mode magnitude of the positive-side and negative-side input signals $V_{INP}, V_{INN}$, such that as the common mode magnitude of the positive-side and negative-side input signals $V_{INP}, V_{INN}$ increases, the magnitudes of any or all of the first, second, third, and fourth current source currents $I_{CS1}, I_{CS2}, I_{CS3}, I_{CS4}$ may increase, and as the common mode magnitude of the positive-side and negative-side input signals $V_{INP}, V_{INN}$ decreases, the magnitudes of any or all of the first, second, third, and fourth current source currents $I_{CS1}, I_{CS2}, I_{CS3}, I_{CS4}$ may decrease. Any or all of the first, second, third, and fourth current source currents $I_{CS1}, I_{CS2}, I_{CS3}, I_{CS4}$ may or may not be proportional to the common mode magnitude of the positive-side and negative-side input signals $V_{INP}, V_{INN}$.

The magnitude of the detector output signal $V_{DOUT}$ may be directly related to a differential magnitude of the positive-side and negative-side input signals $V_{INP}, V_{INN}$, such that as the differential magnitude of the positive-side and negative-side input signals $V_{INP}, V_{INN}$ increases, the magnitude of the detector output signal $V_{DOUT}$ increases, and as the differential magnitude of the positive-side and negative-side input signals $V_{INP}, V_{INN}$ decreases, the magnitude of the detector output signal $V_{DOUT}$ decreases. The magnitude of the detector output signal $V_{DOUT}$ may or may not be proportional to the differential magnitude of the positive-side and negative-side input signals $V_{INP}, V_{INN}$. The differential magnitude of the positive-side and negative-side input signals $V_{INP}, V_{INN}$ is about equal to a difference between the magnitude of the positive-side input signal $V_{INP}$ and the magnitude of the negative-side input signal $V_{INN}$.

Since the first, second, third, and fourth current source currents $I_{CS1}, I_{CS2}, I_{CS3}, I_{CS4}$ are based on the detector output signal $V_{DOUT}$, the magnitudes of any or all of the first, second, third, and fourth current source currents $I_{CS1}, I_{CS2}, I_{CS3}, I_{CS4}$ may be directly related to the differential magnitude of the positive-side and negative-side input signals $V_{INP}, V_{INN}$, such that as the differential magnitude of the positive-side and negative-side input signals $V_{INP}, V_{INN}$ increases, the magnitudes of any or all of the first, second, third, and fourth current source currents $I_{CS1}, I_{CS2}, I_{CS3}, I_{CS4}$ may increase, and as the differential magnitude of the positive-side and negative-side input signals $V_{INP}, V_{INN}$ decreases, the magnitudes of any or all of the first, second, third, and fourth current source currents $I_{CS1}, I_{CS2}, I_{CS3}, I_{CS4}$ may decrease. Any or all of the first, second, third, and fourth current source currents $I_{CS1}, I_{CS2}, I_{CS3}, I_{CS4}$ may or may not be proportional to the common mode magnitude of the positive-side and negative-side input signals $V_{INP}, V_{INN}$.

Figure 4:
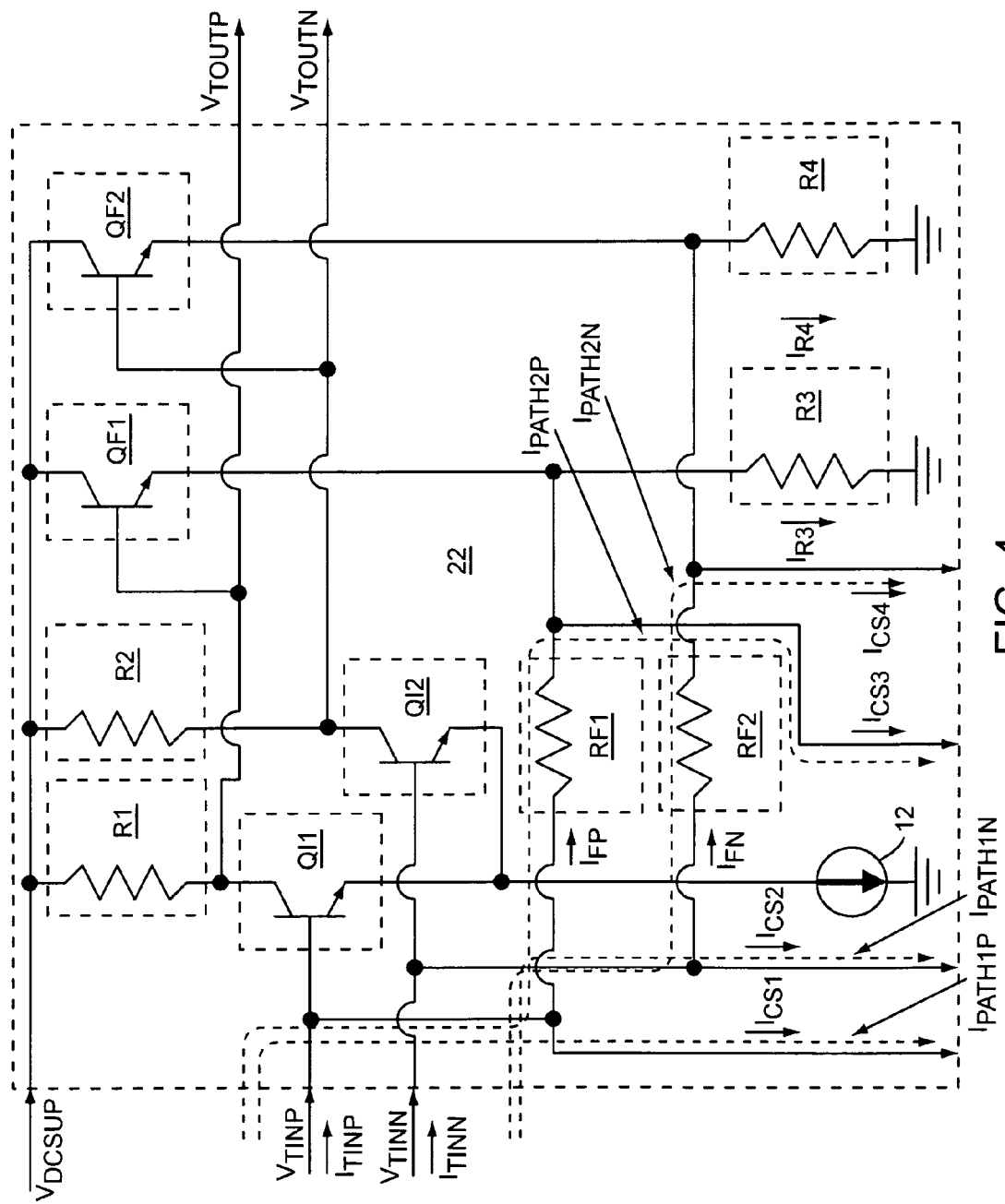
FIG. 4 shows details of a linearized differential transimpedance amplifier illustrated in FIG. 3 according to one embodiment of the linearized transimpedance amplifier.

FIG. 4 shows details of the linearized differential transimpedance amplifier 22 illustrated in FIG. 3 according to one embodiment of the linearized differential transimpedance amplifier 22. The linearized differential transimpedance amplifier 22 includes the first input transistor element QI1, the second input transistor element QI2, the first feedback transistor element QF1, the second feedback transistor element QF2, the first resistive element R1 coupled between the collector of the first input transistor element QI1 and a DC supply bus, the second resistive element R2 coupled between the collector of the second input transistor element QI2 and the DC supply bus, the third resistive element R3 coupled between the emitter of the first feedback transistor element QF1 and ground, the fourth resistive element R4 coupled between the emitter of the second feedback transistor element QF2 and ground, the first current source 12 coupled between the emitter of the first input transistor element QI1 and ground, the first feedback resistive element RF1 coupled between the emitter of the first feedback transistor element QF1 and the base of the first input transistor element QI1, and the second feedback resistive element RF2 coupled between the emitter of the second feedback transistor element QF2 and the base of the second input transistor element QI2.

The collector of the first input transistor element QI1 is coupled to the base of the first feedback transistor element QF1 and the collector of the second input transistor element QI2 is coupled to the base of the second feedback transistor element QF2. The emitter of the first input transistor element QI1 is coupled to the emitter of the second input transistor element QI2. The collectors of the first and second feedback transistor elements QF1, QF2 are coupled to the DC supply bus. The positive-side transimpedance input signal $V_{TINP}$ feeds the base of the first input transistor element QI1 and the negative-side transimpedance input signal $V_{TINN}$ feeds the base of the second input transistor element QI2. The first and second input transistor elements QI1, QI2 may form an amplifier circuit, such that the base of the first input transistor element QI1 functions as a positive-side input to the amplifier circuit, and the base of the second input transistor element QI2 functions as a negative-side input to the amplifier circuit. The positive-side and negative-side transimpedance input signals $V_{TINP}, V_{TINN}$ are normally phase-shifted about 180 degrees from one another and form a differential input signal. The collector of the first input transistor element QI1 provides the positive-side transimpedance output signal $V_{TOUTP}$ and the collector of the second input transistor element QI2 provides the negative-side transimpedance output signal $V_{TOUTN}$. The positive-side and negative-side transimpedance output signals $V_{TOUTP}, V_{TOUTN}$ are normally phase-shifted about 180 degrees from one another and form a differential output signal. The DC supply signal $V_{DCSUP}$ feeds the DC supply bus.

The first and second input transistor elements QI1, QI2, the first and second resistive elements R1, R2, and the first current source 12 form a differential amplifier. The bases of the first and second input transistor elements QI1, QI2 are inputs to the differential amplifier, and the collectors of the first and second input transistor elements QI1, QI2 are outputs from the differential amplifier. The first and second feedback transistor elements QF1, QF2, the third and fourth resistive elements R3, R4, and the first and second feedback resistive elements RF1, RF2 form a feedback circuit that provides feedback from the outputs of the differential amplifier back to the inputs of the differential amplifier. Therefore, the linearized differential transimpedance amplifier 22 may operate as a differential amplifier with differential feedback.

Since the linearized differential transimpedance amplifier 22 is a transimpedance amplifier, which is commonly used to convert a differential input current to a differential output voltage, the positive-side and negative-side transimpedance input signals $V_{TINP}, V_{TINN}$ are normally associated with the positive-side and negative-side transimpedance input currents $I_{TINP}, I_{TINN}$, respectively. Most of the positive-side and negative-side transimpedance input currents $I_{TINP}, I_{TINN}$ may flow through the first and second feedback resistive elements RF1, RF2, respectively. The first and second feedback resistive elements RF1, RF2 have the positive-side and negative-side feedback currents $I_{FP}, I_{FN}$, respectively, which may be slightly less than the positive-side and negative-side transimpedance input currents $I_{TINP}, I_{TINN}$. The positive-side and negative-side feedback currents $I_{FP}, I_{FN}$ and currents from the emitters of the first and second feedback transistor elements QF1, QF2 combine to feed the third and fourth resistive elements R3, R4, respectively, which have the third and fourth resistive currents $I_{R3}$, $I_{R4}$, respectively.

Since the linearized differential transimpedance amplifier 22 may operate as a differential amplifier with differential feedback, a voltage difference between the positive-side and negative-side transimpedance output signals $V_{TOUTP}$, $V_{TOUTN}$ may be based on a current difference between the positive-side and negative-side transimpedance input currents $I_{TINP}$, $I_{TINN}$.

The positive-side transimpedance input current $I_{TINP}$ provides the positive-side feedback current $I_{FP}$ and the first current source current $I_{CS1}$, and the negative-side transimpedance input current $I_{TINN}$ provides the negative-side feedback current $I_{FN}$ and the second current source current $I_{CS2}$. The positive-side feedback current $I_{FP}$ and the current from the emitter of the first feedback transistor element QF1 combine to provide the third resistive current $I_{R3}$ and the third current source current $I_{CS3}$, and the negative-side feedback current $I_{FN}$ and the current from the emitter of the second feedback transistor element QF2 combine to provide the fourth resistive current $I_{R4}$ and the fourth current source current $I_{CS4}$.

Part of the positive-side transimpedance input current $I_{TINP}$ and the entire first current source current $I_{CS1}$ may follow a first positive-side current path $I_{PATH1P}$. Part of the positive-side transimpedance input current $I_{TINP}$, part of the positive-side feedback current $I_{FP}$, and the entire third current source current $I_{CS3}$ may follow a second positive-side current path $I_{PATH2P}$. Part of the negative-side transimpedance input current $I_{TINN}$ and the entire second current source current $I_{CS2}$ may follow a first negative-side current path $I_{PATH1N}$. Part of the negative-side transimpedance input current $I_{TINN}$, part of the negative-side feedback current $I_{FN}$, and the entire fourth current source current $I_{CS4}$ may follow a second negative-side current path $I_{PATH2N}$.

When the common mode magnitude of the positive-side and negative-side transimpedance input currents $I_{TINP}$, $I_{TINN}$ is large, such as in an optical overload power condition, the detected magnitudes associated with the positive-side and negative-side transimpedance input currents $I_{TINP}$, $I_{TINN}$ is also large. Therefore, the first and second current source currents $I_{CS1}$, $I_{CS2}$, the third and fourth current source currents $I_{CS3}$, $I_{CS4}$, or the first, second, third, and fourth current source currents $I_{CS1}$, $I_{CS2}$, $I_{CS3}$, $I_{CS4}$ may be large to keep the voltages across the first and second feedback resistive elements RF1, RF2 in a linear operating region. As the common mode magnitude of the positive-side and negative-side transimpedance input currents $I_{TINP}$, $I_{TINN}$ diminishes, the dynamic current source circuitry 28 may be dynamically reconfigured to reduce the first and second current source currents $I_{CS1}$, $I_{CS2}$, the third and fourth current source currents $I_{CS3}$, $I_{CS4}$, or the first, second, third, and fourth current source currents $I_{CS1}$, $I_{CS2}$, $I_{CS3}$, $I_{CS4}$ to keep the voltages across the first and second feedback resistive elements RF1, RF2 in the linear operating region by preserving adequate operating headroom and providing sufficient voltages for adequate sensitivity.

The first and second current source currents $I_{CS1}$, $I_{CS2}$ may be dynamically controlled separately from the third and fourth current source currents $I_{CS3}$, $I_{CS4}$ to trade-off certain characteristics at different common mode magnitudes of the positive-side and negative-side transimpedance input currents $I_{TINP}$, $I_{TINN}$. In general, the first and second current source currents $I_{CS1}$, $I_{CS2}$ may be used to preserve operating headroom, but at the expense of reduced sensitivity and increased input noise. The third and fourth current source currents $I_{CS3}$, $I_{CS4}$ may be used to preserve operating headroom up to a point, with less reduced sensitivity and less increased input noise compared to using the first and second current source currents $I_{CS1}$, $I_{CS2}$. An alternate embodiment of the linearized differential transimpedance amplifier 22 may omit the first and second current source currents $I_{CS1}$, $I_{CS2}$. An additional embodiment of the linearized differential transimpedance amplifier 22 may omit the third and fourth current source currents $I_{CS3}$, $I_{CS4}$.

Figure 5:
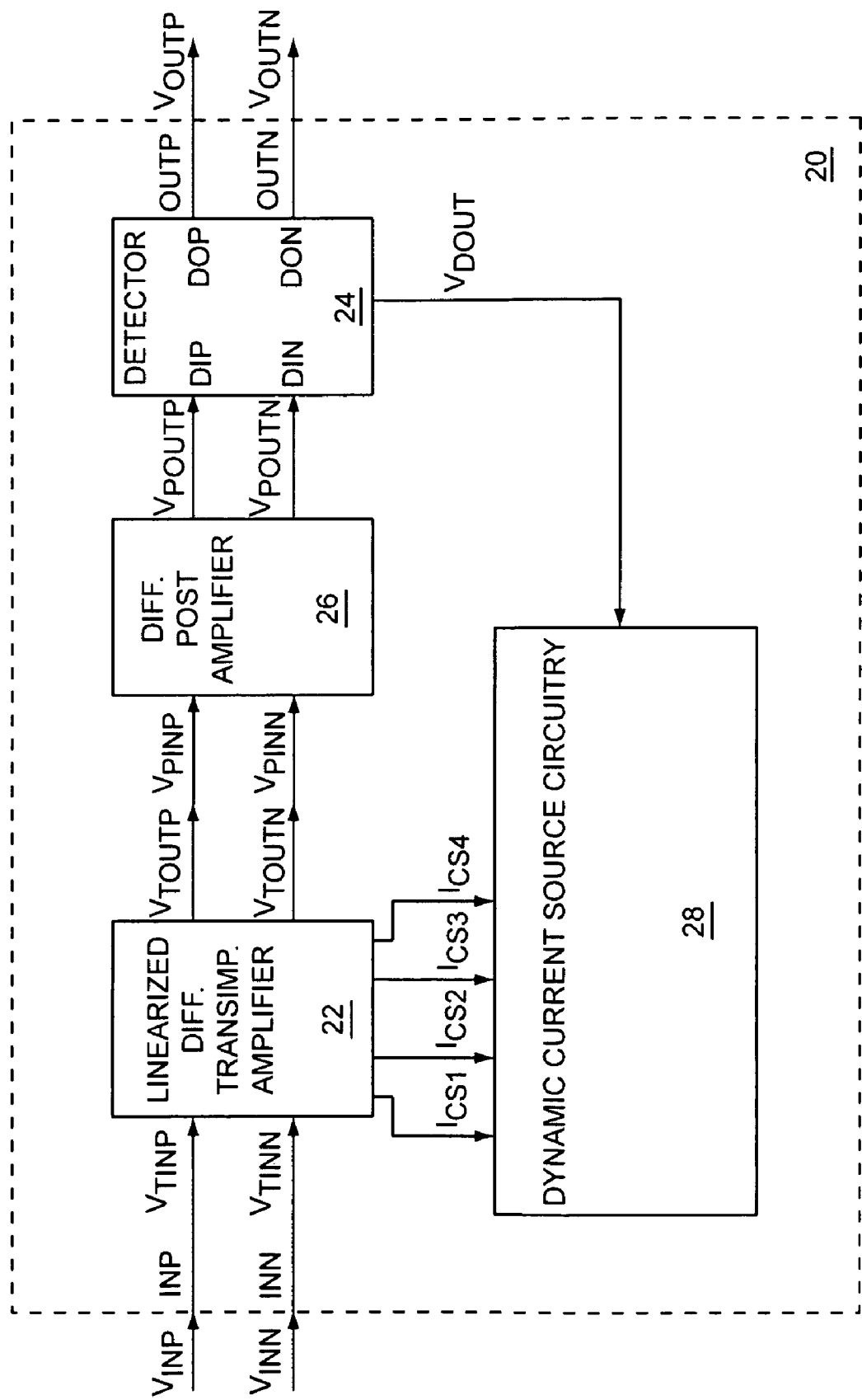
FIG. 5 shows the transimpedance amplifier circuit according to an alternate embodiment of the present invention.

FIG. 5 shows the transimpedance amplifier circuit 20 according to an alternate embodiment of the present invention. The transimpedance amplifier circuit 20 illustrated in FIG. 5 is similar to the transimpedance amplifier circuit 20 illustrated in FIG. 3, except in FIG. 3 the detector 24 is coupled between the linearized differential transimpedance amplifier 22 and the differential post amplifier 26, whereas in FIG. 5 the detector 24 is coupled between the differential post amplifier 26 and the positive-side and negative-side outputs OUTP, OUTN. Specifically, the differential post amplifier 26 provides the positive-side and negative-side post amplifier output signals $V_{POUTP}$, $V_{POUTN}$ to the positive-side and negative-side detector inputs DIP, DIN, respectively, of the detector 24. The positive-side and negative-side detector inputs DIP, DIN of the detector 24 are coupled to the positive-side and negative-side outputs OUTP, OUTN of the transimpedance amplifier circuit 20. The detector 24 provides the detector output signal $V_{DOUT}$ to the dynamic current source circuitry 28 based on magnitudes of the positive-side and negative-side post amplifier output signals $V_{POUTP}$, $V_{POUTN}$, which may be indicative of the magnitudes of the positive-side and negative-side input signals $V_{INP}$, $V_{INN}$. The positive-side and negative-side transimpedance output signals $V_{TOUTP}$, $V_{TOUTN}$ provide the positive-side and negative-side post amplifier input signals $V_{PINP}$, $V_{PINN}$, respectively.

Figure 6:
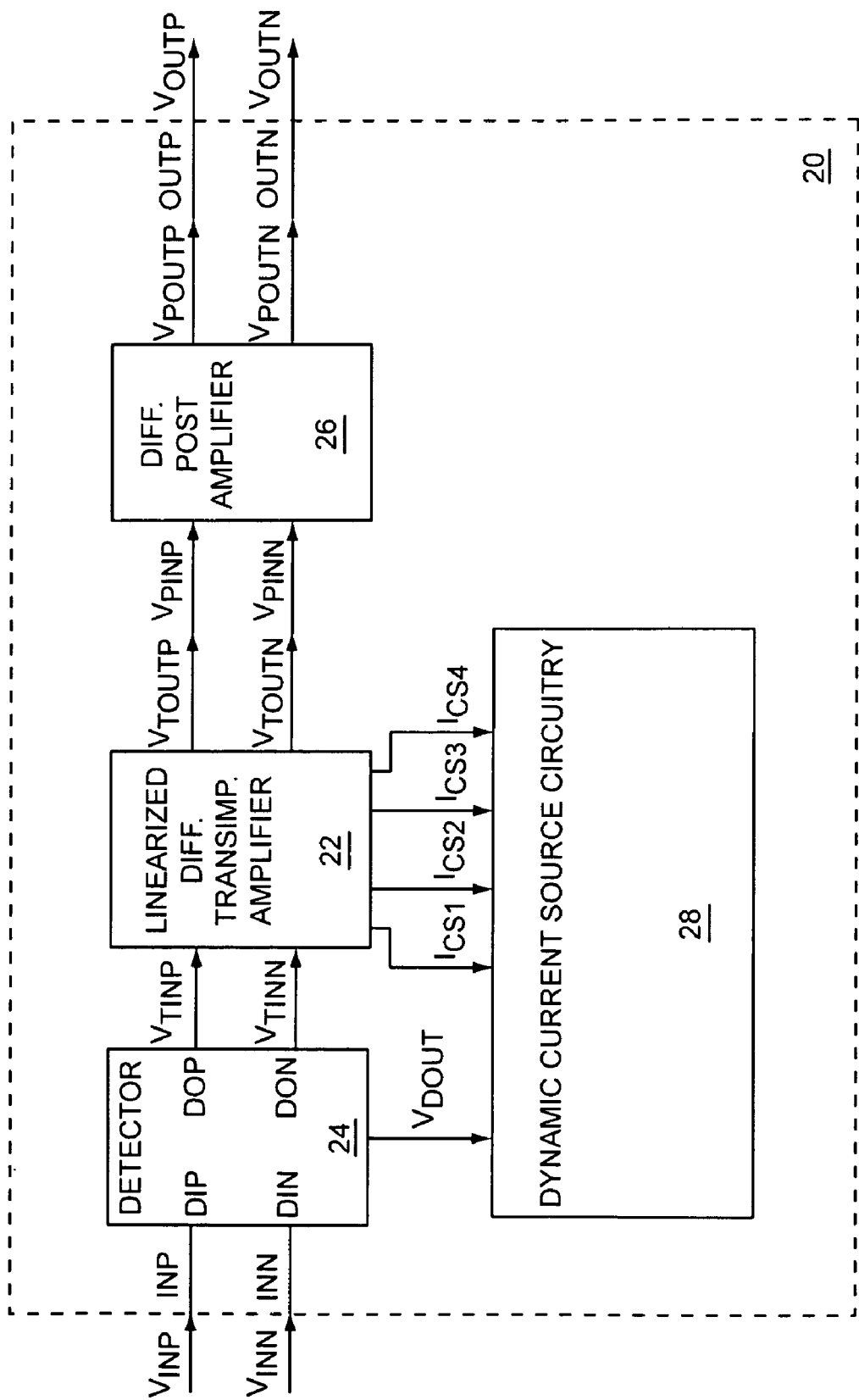
FIG. 6 shows the transimpedance amplifier circuit according to an additional embodiment of the present invention.

FIG. 6 shows the transimpedance amplifier circuit 20 according to an additional embodiment of the present invention. The transimpedance amplifier circuit 20 illustrated in FIG. 6 is similar to the transimpedance amplifier circuit 20 illustrated in FIG. 3, except in FIG. 3 the detector 24 is coupled between the linearized differential transimpedance amplifier 22 and the differential post amplifier 26, whereas in FIG. 6 the detector 24 is coupled between the positive-side and negative-side inputs INP, INN of the transimpedance amplifier circuit 20 and the linearized differential transimpedance amplifier 22. Specifically, the positive-side and negative-side inputs INP, INN of the transimpedance amplifier circuit 20 are coupled to the positive-side and negative-side detector inputs DIP, DIN, respectively, of the detector 24. The positive-side and negative-side detector outputs DOP, DON detector 24 provide the positive-side and negative-side transimpedance input signals $V_{TINP}$, $V_{TINN}$ to the linearized differential transimpedance amplifier 22. The detector 24 provides the detector output signal $V_{DOUT}$ to the dynamic current source circuitry 28 based on magnitudes of the positive-side and negative-side input signals $V_{INP}$, $V_{INN}$. The positive-side and negative-side transimpedance output signals $V_{TOUTP}$, $V_{TOUTN}$ provide the positive-side and negative-side post amplifier input signals $V_{PINP}$, $V_{PINN}$, respectively.

Figure 7:
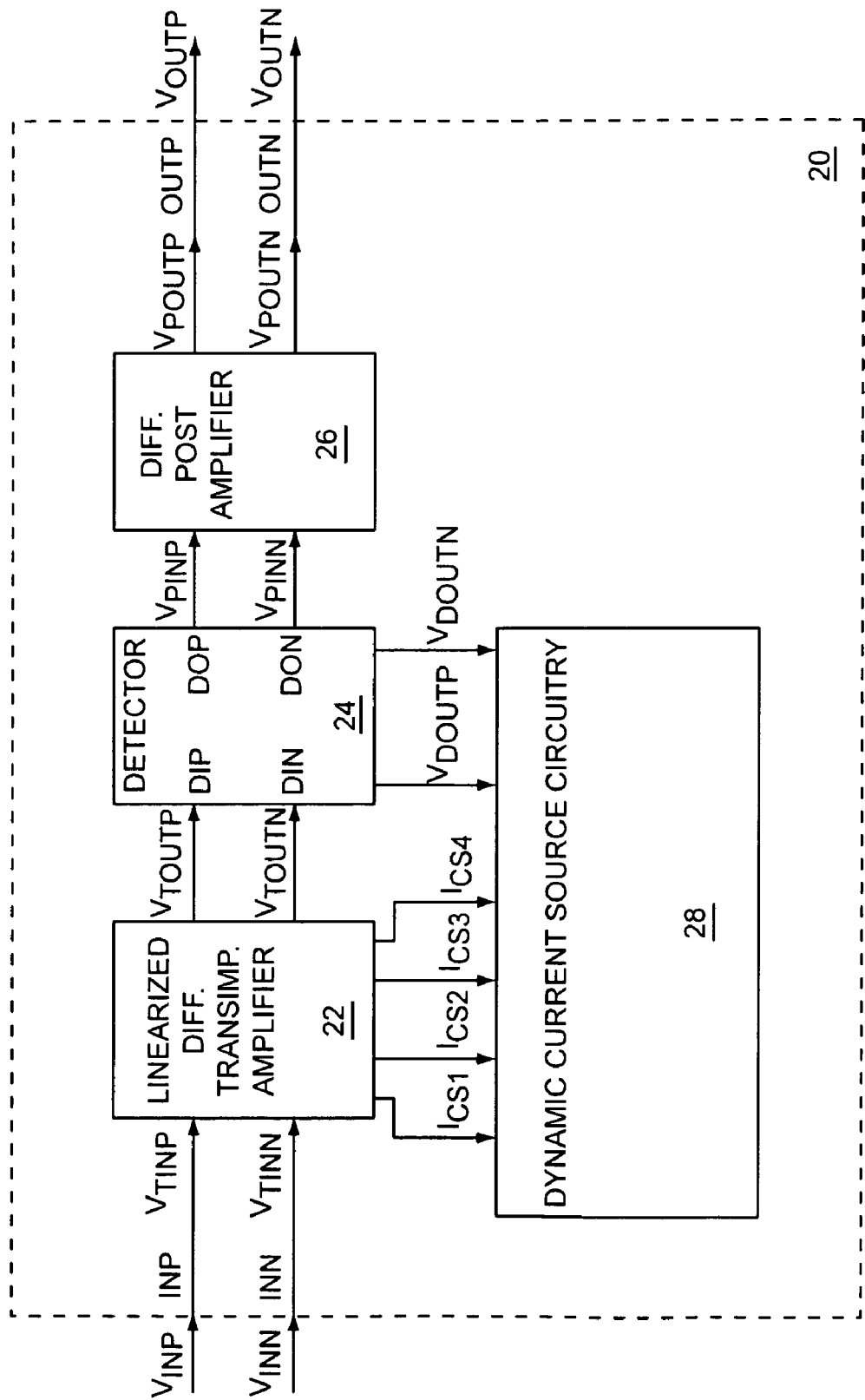
FIG. 7 shows the transimpedance amplifier circuit according to another embodiment of the present invention.

FIG. 7 shows the transimpedance amplifier circuit 20 according to another embodiment of the present invention. The transimpedance amplifier circuit 20 illustrated in FIG. 7 is similar to the transimpedance amplifier circuit 20 illustrated in FIG. 3, except in FIG. 3 the detector 24 provides the detector output signal $V_{DOUT}$ to the dynamic current source circuitry 28 based on magnitudes of both the positive-side and negative-side transimpedance output signals $V_{TOUTP}$, $V_{TOUTN}$, whereas in FIG. 7 the detector 24 provides a positive-side detector output signal $V_{DOUTP}$ and a negative-side detector output signal $V_{DOUTN}$ to the dynamic current source circuitry 28. The positive-side detector output signal $V_{DOUTP}$ is based on the positive-side transimpedance output signal $V_{TOUTP}$, and the negative-side detector output signal $V_{DOUTN}$ is based on the negative-side transimpedance output signal $V_{TOUTN}$. The first and third current source currents $I_{CS1}$, $I_{CS3}$ are based on the positive-side detector output signal $V_{DOUTP}$, and the second and fourth current source currents $I_{CS2}$, $I_{CS4}$ are based on the negative-side detector output signal $V_{DOUTN}$.

Figure 8:
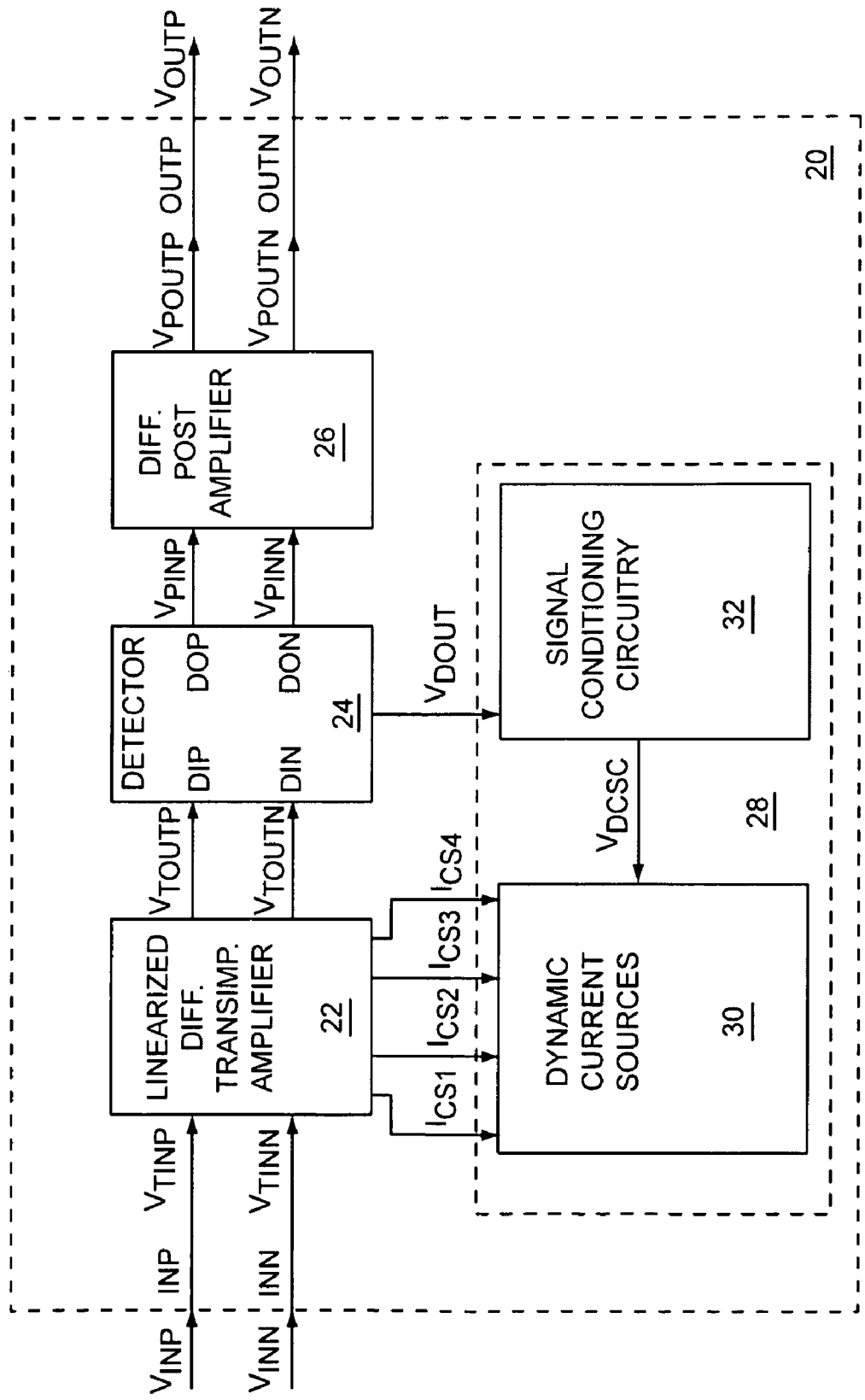
FIG. 8 shows details of dynamic current source circuitry illustrated in FIG. 3 according to one embodiment of the dynamic current source circuitry.

FIG. 8 shows details of the dynamic current source circuitry 28 illustrated in FIG. 3 according to one embodiment of the dynamic current source circuitry 28. The dynamic current source circuitry 28 includes dynamic current sources 30 and signal conditioning circuitry 32. The detector output signal $V_{DOUT}$ is fed to the signal conditioning circuitry 32, which may amplify, filter, level-shift, or any combination thereof, the detector output signal $V_{DOUT}$ to provide a signal conditioned detector output signal $V_{DCSC}$ to the dynamic current sources 30. The magnitudes of the first, second, third, and fourth current source currents $I_{CS1}$, $I_{CS2}$, $I_{CS3}$, $I_{CS4}$ are based on the signal conditioned detector output signal $V_{DCSC}$.

Figure 9:
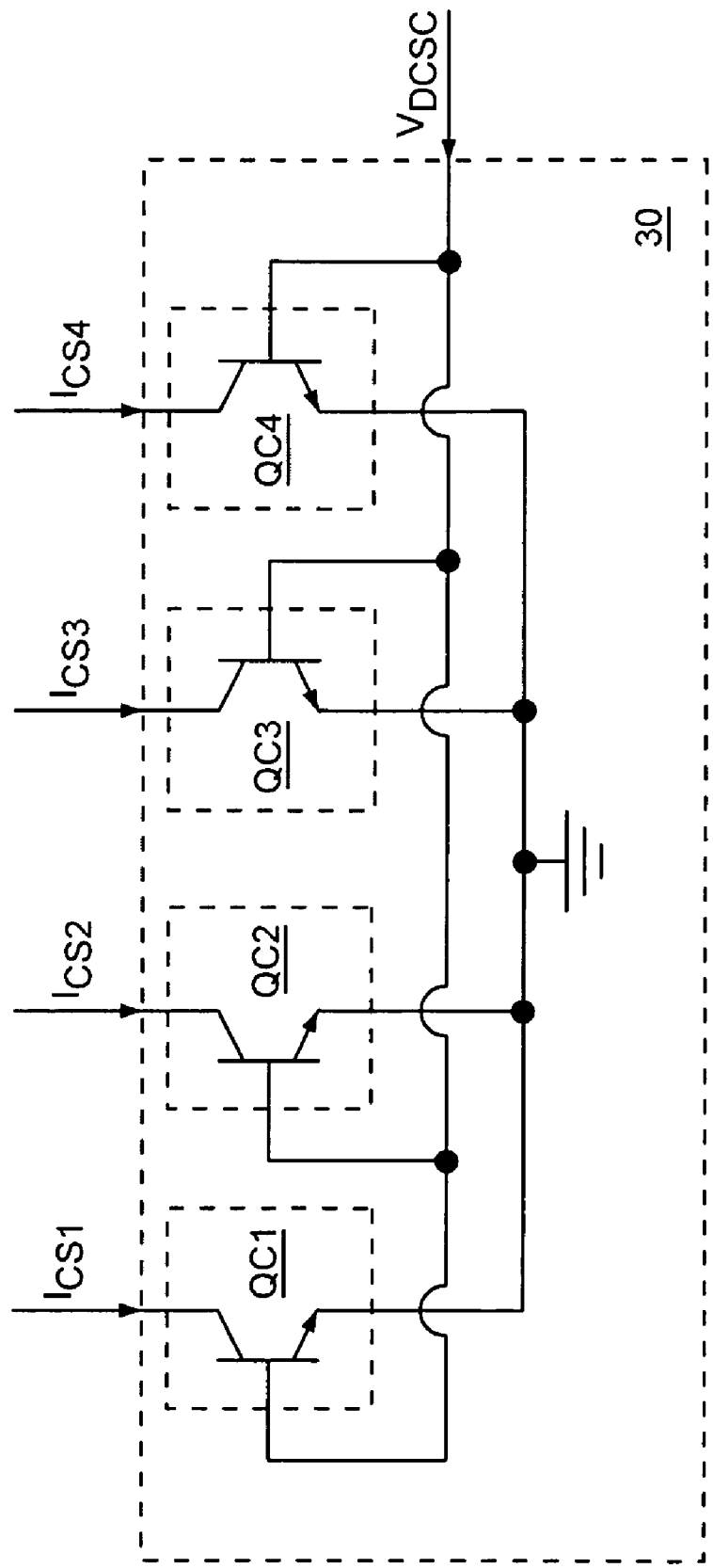
FIG. 9 shows details of dynamic current sources illustrated in FIG. 8 according to one embodiment of the dynamic current sources.

FIG. 9 shows details of the dynamic current sources 30 illustrated in FIG. 8 according to one embodiment of the dynamic current sources 30. The dynamic current sources 30 include a first current source transistor element QC1, a second current source transistor element QC2, a third current source transistor element QC3, and fourth current source transistor element QC4. Bases of the first, second, third, and fourth current source transistor elements QC1, QC2, QC3, QC4 are coupled together and receive the signal conditioned detector output signal $V_{DCSC}$. Emitters of the first, second, third, and fourth current source transistor elements QC1, QC2, QC3, QC4 are coupled to ground. In an alternate embodiment of the dynamic current sources 30, the emitters of the first, second, third, and fourth current source transistor elements QC1, QC2, QC3, QC4 are coupled to a DC reference. Collectors of the first, second, third, and fourth current source transistor elements QC1, QC2, QC3, QC4 receive the first, second, third, and fourth current source currents $I_{CS1}$, $I_{CS2}$, $I_{CS3}$, $I_{CS4}$, respectively.

The first, second, third, and fourth current source transistor elements QC1, QC2, QC3, QC4 may be matched to one another, and may be matched to a transistor element (not shown) in the signal conditioning circuitry 32 having a current source pilot current based on the detector output signal $V_{DOUT}$. The signal conditioned detector output signal $V_{DCSC}$ may be based on the current source pilot current, and the first, second, third, and fourth current source currents $I_{CS1}$, $I_{CS2}$, $I_{CS3}$, $I_{CS4}$ may mirror the current source pilot current. The first, second, third, and fourth current source currents $I_{CS1}$, $I_{CS2}$, $I_{CS3}$, $I_{CS4}$ may be about equal to one another.

Figure 10:
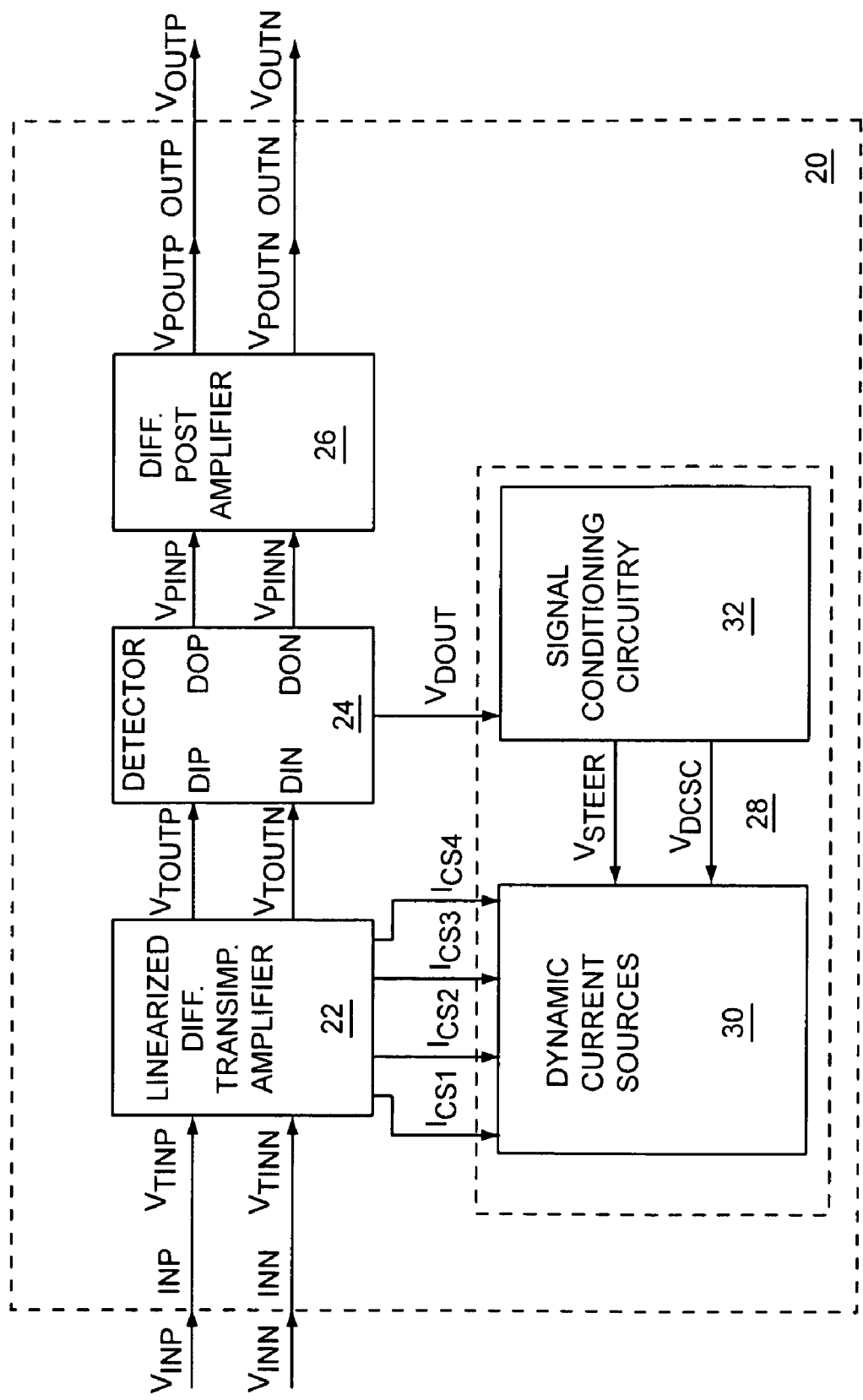
FIG. 10 shows details of the dynamic current source circuitry illustrated in FIG. 3 according to an alternate embodiment of the dynamic current source circuitry.

FIG. 10 shows details of the dynamic current source circuitry 28 illustrated in FIG. 3 according to an alternate embodiment of the dynamic current source circuitry 28. The dynamic current source circuitry 28 includes the dynamic current sources 30 and the signal conditioning circuitry 32. The detector output signal $V_{DOUT}$ is fed to the signal conditioning circuitry 32, which may amplify, filter, level-shift, or any combination thereof, the detector output signal $V_{DOUT}$ to provide the signal conditioned detector output signal $V_{DCSC}$ and a steering signal $V_{STEER}$ to the dynamic current sources 30. The dynamic current sources 30 may be controlled, such that a sum of the magnitudes of the first, second, third, and fourth current source currents $I_{CS1}$, $I_{CS2}$, $I_{CS3}$, $I_{CS4}$ may be based on the signal conditioned detector output signal $V_{DCSC}$, and a ratio of a sum of the magnitudes of the first and second current source currents $I_{CS1}$, $I_{CS2}$ divided by a sum of the magnitudes of the third and fourth current source currents $I_{CS3}$, $I_{CS4}$ is based on the steering signal $V_{STEER}$. Therefore, the steering signal $V_{STEER}$ may be used to dynamically control the first and second current source currents $I_{CS1}$, $I_{CS2}$ separately from the third and fourth current source currents $I_{CS3}$, $I_{CS4}$ to trade-off certain characteristics at different common mode magnitudes of the positive-side and negative-side transimpedance input currents $I_{TINP}$, $I_{TINN}$.

Figure 11:
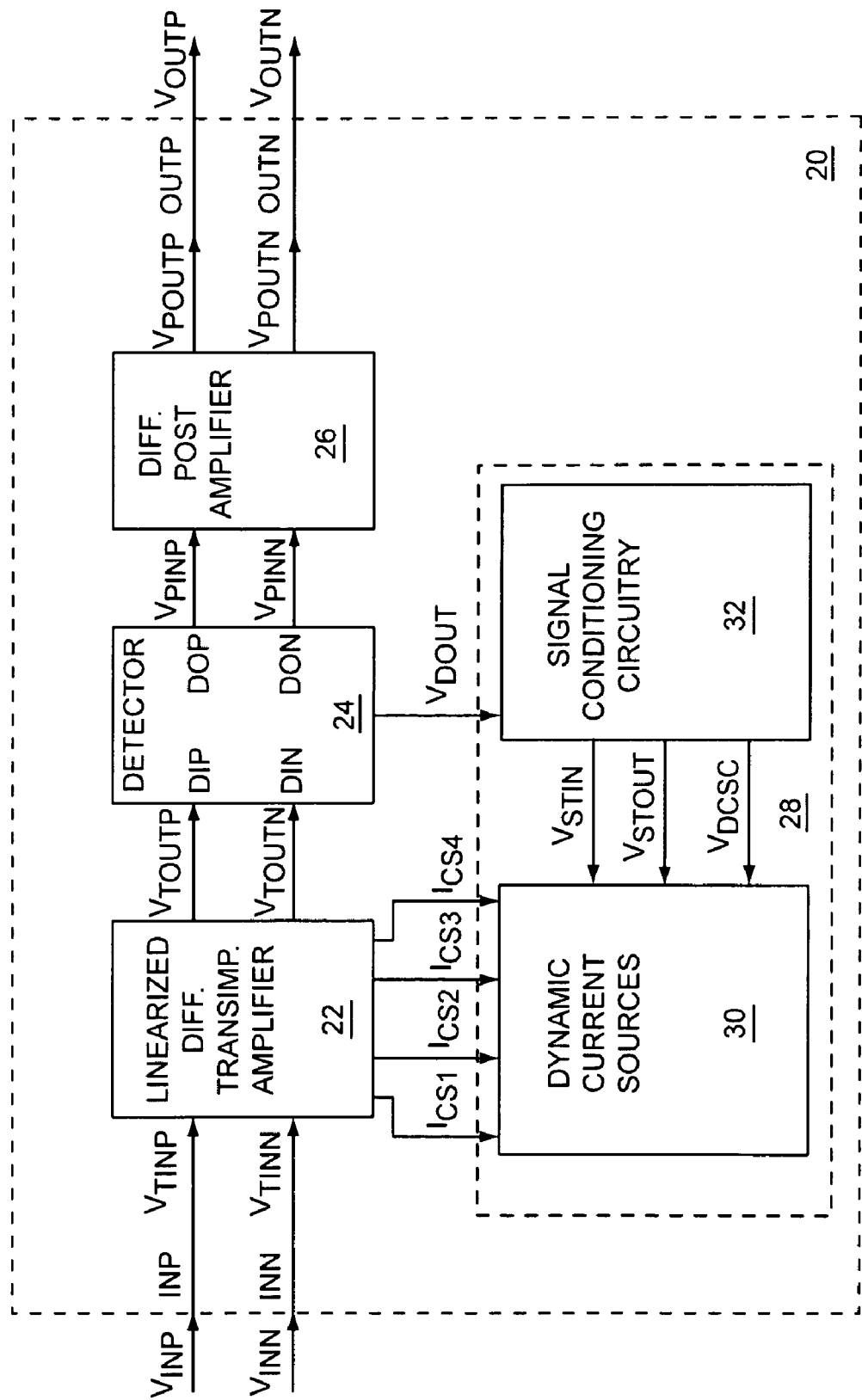
FIG. 11 shows details of the dynamic current source circuitry illustrated in FIG. 3 according to an additional embodiment of the dynamic current source circuitry.

FIG. 11 shows details of the dynamic current source circuitry 28 illustrated in FIG. 3 according to an additional embodiment of the dynamic current source circuitry 28. The dynamic current source circuitry 28 illustrated in FIG. 11 is similar to the dynamic current source circuitry 28 illustrated in FIG. 10 except the steering signal $V_{STEER}$ illustrated in FIG. 10 is replaced with an input side steering signal $V_{STIN}$ and an output side steering signal $V_{STOUT}$ in FIG. 11. The dynamic current sources 30 may be controlled, such that the sum of the magnitudes of the first, second, third, and fourth current source currents $I_{CS1}$, $I_{CS2}$, $I_{CS3}$, $I_{CS4}$ may be based on the signal conditioned detector output signal $V_{DCSC}$. Additionally, the first and second current source currents $I_{CS1}$, $I_{CS2}$ may be dynamically controlled separately from the third and fourth current source currents $I_{CS3}$, $I_{CS4}$ to trade-off certain characteristics at different common mode magnitudes of the positive-side and negative-side transimpedance input currents $I_{TINP}$, $I_{TINN}$. The first and second current source currents $I_{CS1}$, $I_{CS2}$ may be additionally controlled based on the input side steering signal $V_{STIN}$, and the third and fourth current source currents $I_{CS3}$, $I_{CS4}$ may be additionally controlled based on the output side steering signal $V_{STOUT}$. The input side and output side steering signals $V_{STIN}$, $V_{STOUT}$ and the signal conditioned detector output signal $V_{DCSC}$ are based on the detector output signal $V_{DOUT}$.

Figure 12:
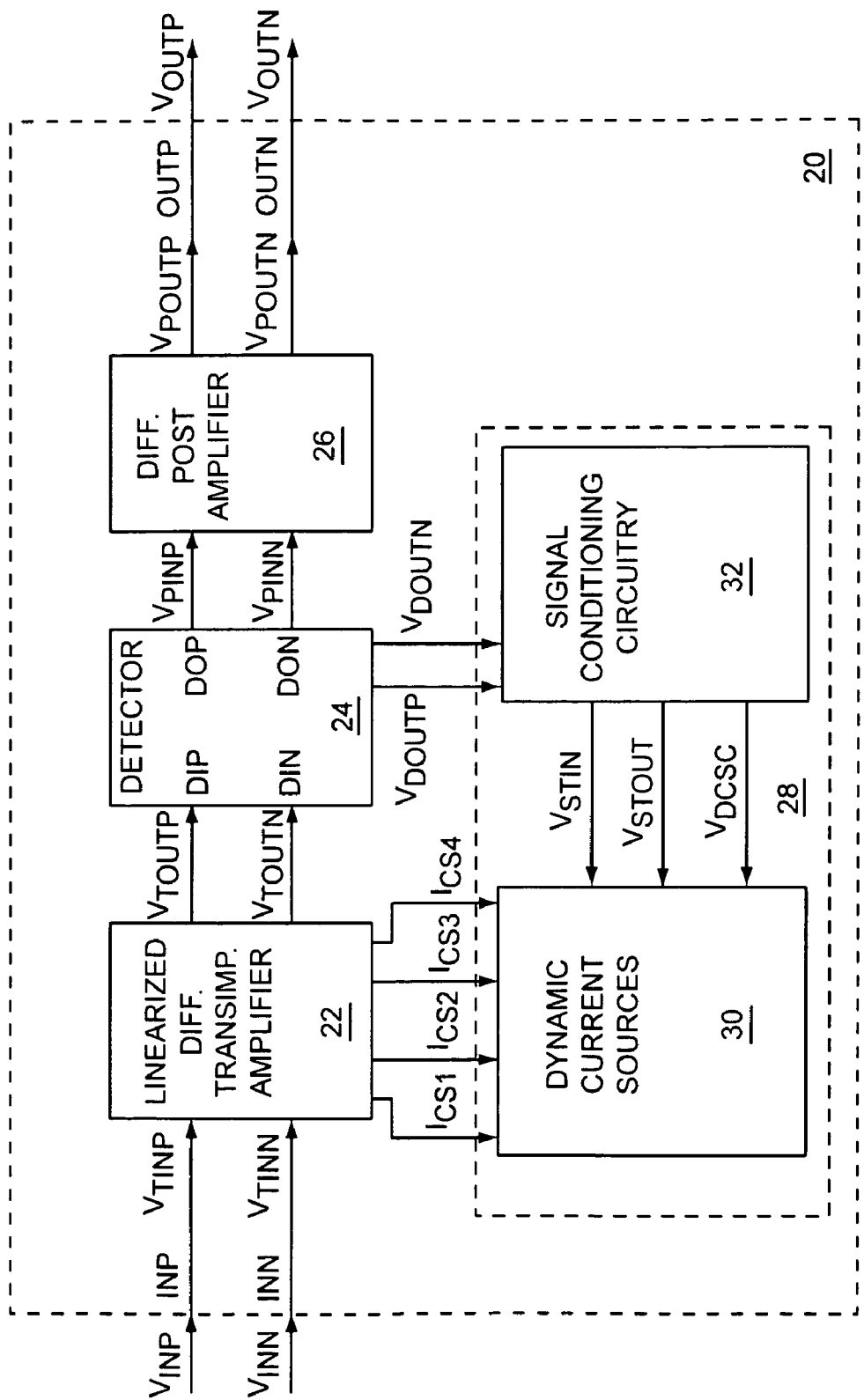
FIG. 12 shows details of the dynamic current source circuitry illustrated in FIG. 7 according to one embodiment of the transimpedance amplifier circuit.

FIG. 12 shows details of the dynamic current source circuitry 28 illustrated in FIG. 7 according to one embodiment of the transimpedance amplifier circuit 20. The dynamic current source circuitry 28 illustrated in FIG. 12 is similar to the dynamic current source circuitry 28 illustrated in FIG. 11, except that the signal conditioning circuitry 32 illustrated in FIG. 12 receives the positive-side and negative-side detector output signals $V_{DOUTP}$, $V_{DOUTN}$, whereas the signal conditioning circuitry 32 illustrated in FIG. 11 receives the detector output signal $V_{DOUT}$. The dynamic current sources 30 may be controlled, such that the sum of the magnitudes of the first, second, third, and fourth current source currents $I_{CS1}$, $I_{CS2}$, $I_{CS3}$, $I_{CS4}$ may be based on the signal conditioned detector output signal $V_{DCSC}$. Additionally, the first and second current source currents $I_{CS1}$, $I_{CS2}$ may be dynamically controlled separately from the third and fourth current source currents $I_{CS3}$, $I_{CS4}$ to trade-off certain characteristics at different common mode magnitudes of the positive-side and negative-side transimpedance input currents $I_{TINP}$, $I_{TINN}$. The first and second current source currents $I_{CS1}$, $I_{CS2}$ may be additionally controlled based on the input side steering signal $V_{STIN}$ and the third and fourth current source currents $I_{CS3}$, $I_{CS4}$ may be additionally controlled based on the output side steering signal $V_{STOUT}$.

The detector output signal $V_{DOUT}$ may be based on the positive-side and negative-side detector output signals $V_{DOUTP}$, $V_{DOUTN}$, a ratio of the positive-side and negative-side detector output signals $V_{DOUTP}$, $V_{DOUTN}$, a sum of the positive-side and negative-side detector output signals $V_{DOUTP}$, $V_{DOUTN}$, a difference between the positive-side and negative-side detector output signals $V_{DOUTP}$, $V_{DOUTN}$, or any combination thereof. The input side steering signal $V_{STIN}$ may be based on the positive-side detector output signal $V_{DOUTP}$, the positive-side and negative-side detector output signals $V_{DOUTP}$, $V_{DOUTN}$, a ratio of the positive-side and negative-side detector output signals $V_{DOUTP}$, $V_{DOUTN}$, a sum of the positive-side and negative-side detector output signals $V_{DOUTP}$, $V_{DOUTN}$, a difference between the positive-side and negative-side detector output signals $V_{DOUTP}$, $V_{DOUTN}$, or any combination thereof. The output side steering signal $V_{STOUT}$ may be based on the negative-side detector output signal $V_{DOUTN}$, the positive-side and negative-side detector output signals $V_{DOUTP}$, $V_{DOUTN}$, a ratio of the positive-side and negative-side detector output signals $V_{DOUTP}$, $V_{DOUTN}$, a sum of the positive-side and negative-side detector output signals $V_{DOUTP}$, $V_{DOUTN}$, a difference between the positive-side and negative-side detector output signals $V_{DOUTP}$, $V_{DOUTN}$, or any combination thereof.

Figure 13:
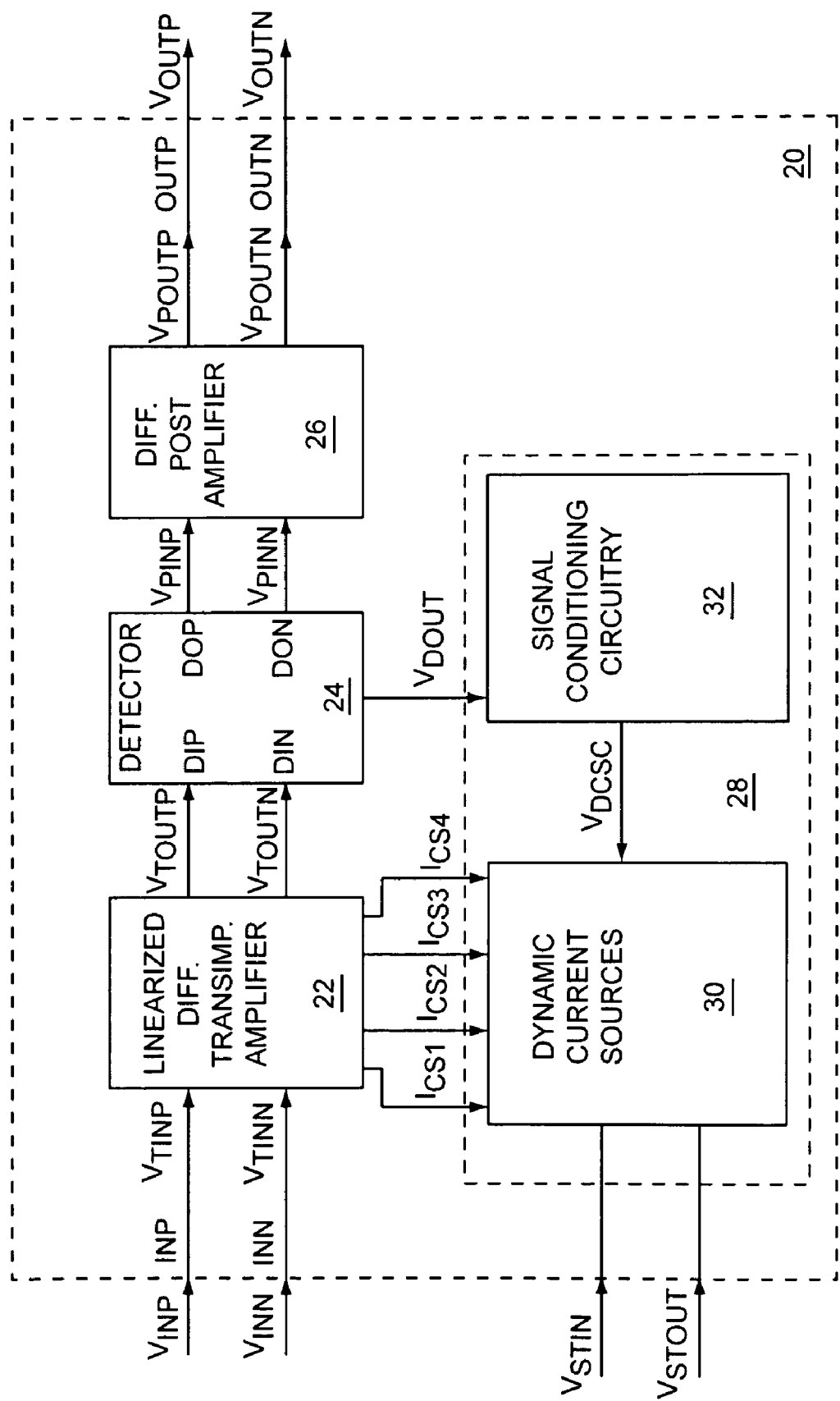
FIG. 13 shows the transimpedance amplifier circuit according to an alternate embodiment of the transimpedance amplifier circuit.

FIG. 13 shows the transimpedance amplifier circuit 20 according to an alternate embodiment of the transimpedance amplifier circuit 20. The transimpedance amplifier circuit 20 illustrated in FIG. 13 is similar to the transimpedance amplifier circuit 20 illustrated in FIG. 11, except in the transimpedance amplifier circuit 20 illustrated in FIG. 11, the input side and output side steering signals $V_{STIN}$, $V_{STOUT}$ are provided by the signal conditioning circuitry 32, whereas in the transimpedance amplifier circuit 20 illustrated in FIG. 13, the input side and output side steering signals $V_{STIN}$, $V_{STOUT}$ are provided by circuitry external to the transimpedance amplifier circuit 20, such as other system circuitry. The magnitudes of the first and second current source currents $I_{CS1}$, $I_{CS2}$ are based on the detector output signal $V_{DOUT}$, the input side steering signal $V_{STIN}$, the output side steering signal $V_{STOUT}$, or any combination thereof. Additionally, the magnitudes of the third and fourth current source currents $I_{CS3}$, $I_{CS4}$ are based on the detector output signal $V_{DOUT}$, the input side steering signal $V_{STIN}$, the output side steering signal $V_{STOUT}$, or any combination thereof.

In an exemplary embodiment of the present invention, the positive-side and negative-side input signals $V_{INP}$, $V_{INN}$ are associated with an input signal range having a maximum magnitude, a midpoint magnitude, and a minimum magnitude. A first threshold is between the midpoint magnitude and the minimum magnitude and a second threshold is between the midpoint magnitude and the maximum magnitude. When the magnitudes associated with the positive-side and negative-side input signals $V_{INP}$, $V_{INN}$ are less than the first threshold, the input side and output side steering signals $V_{STIN}$, $V_{STOUT}$ cause the magnitudes of the third and fourth current source currents $I_{CS3}$, $I_{CS4}$ to be greater than the magnitudes of the first and second current source currents $I_{CS1}$, $I_{CS2}$. When magnitudes associated with the positive-side and negative-side input signals $V_{INP}$, $V_{INN}$ are less than the first threshold, the input side and output side steering signals $V_{STIN}$, $V_{STOUT}$ cause the magnitudes of the third and fourth current source currents $I_{CS3}$, $I_{CS4}$ to be greater than the magnitudes of the first and second current source currents $I_{CS1}$, $I_{CS2}$. Similarly, when the magnitudes associated with the positive-side and negative-side input signals $V_{INP}$, $V_{INN}$ are greater than the second threshold, the input side and output side steering signals $V_{STIN}$, $V_{STOUT}$ cause the magnitudes of the third and fourth current source currents $I_{CS3}$, $I_{CS4}$ to be less than the magnitudes of the first and second current source currents $I_{CS1}$, $I_{CS2}$. The input side and output side steering signals $V_{STIN}$, $V_{STOUT}$ may be based on maximizing a signal-to-noise ratio, maximizing signal clarity, minimizing a bit-error-rate, or any combination thereof.

Figure 14:
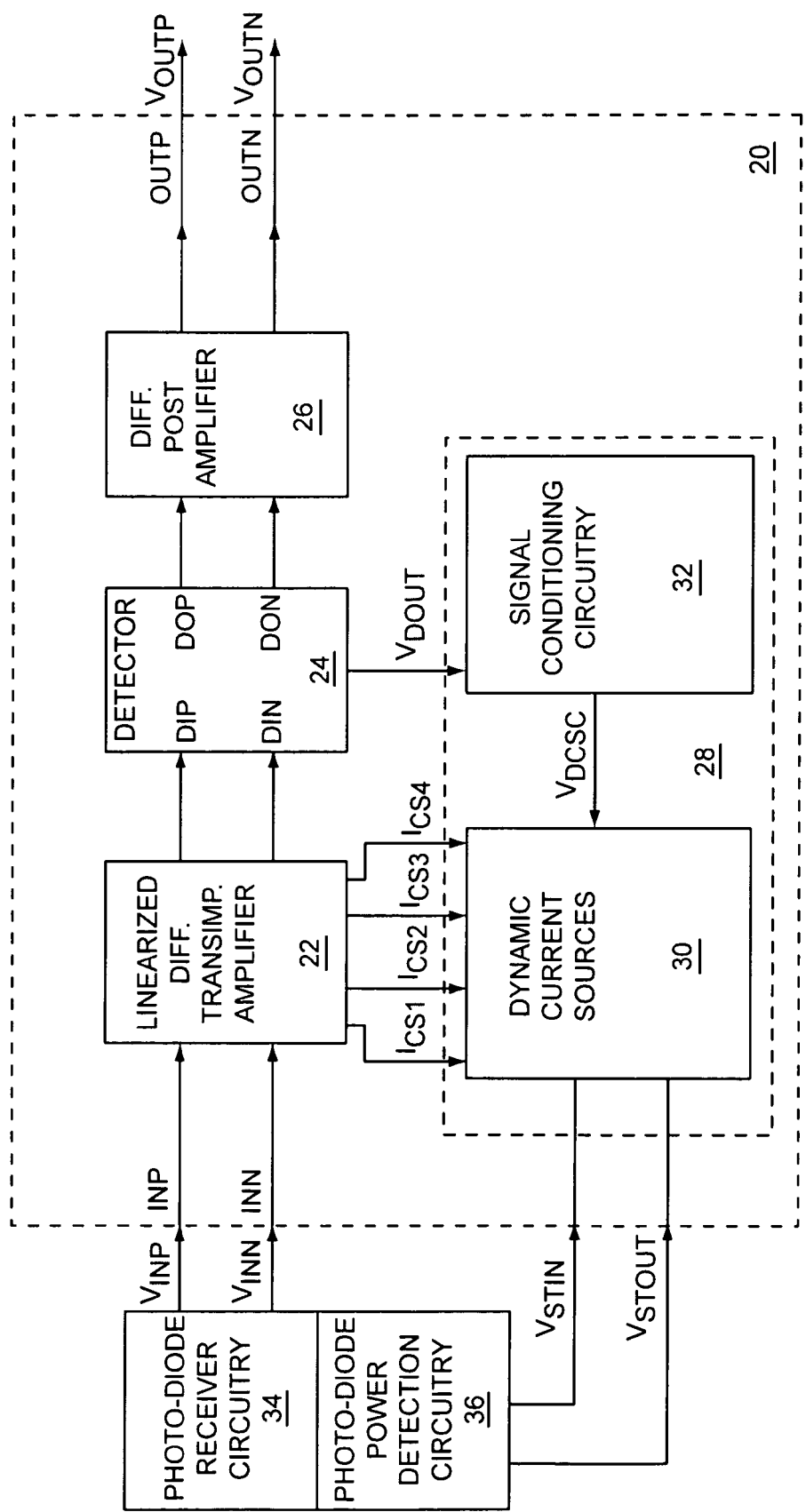
FIG. 14 shows photo-diode receiver circuitry and photo-diode power detection circuitry feeding the transimpedance amplifier circuit illustrated in FIG. 13.

FIG. 14 shows photo-diode receiver circuitry 34 and photo-diode power detection circuitry 36 feeding the transimpedance amplifier circuit 20 illustrated in FIG. 13. The photo-diode receiver circuitry 34, the photo-diode power detection circuitry 36, and the transimpedance amplifier circuit 20 may be part of an optical receiver, which may be used in a fiber-optics based communications system. The photo-diode receiver circuitry 34 provides the positive-side and negative-side input signals $V_{INP}$, $V_{INN}$ to the transimpedance amplifier circuit 20 based on received optical signals. The photo-diode power detection circuitry 36 provides the input side and output side steering signals $V_{STIN}$, $V_{STOUT}$ to the transimpedance amplifier circuit 20 based on detected power of the received optical signals.

Figure 15:
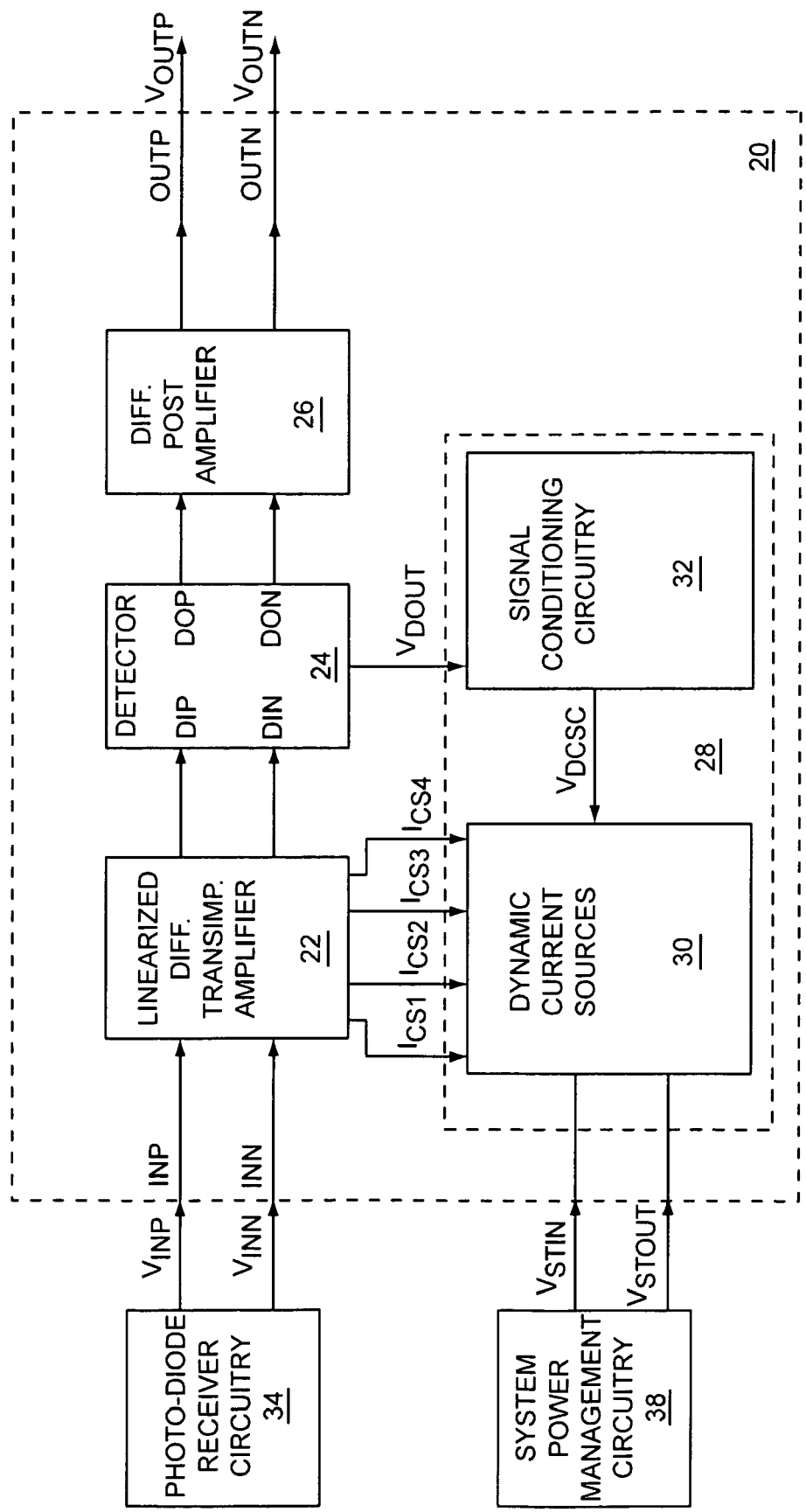
FIG. 15 shows the photo-diode receiver circuitry and system power management circuitry feeding the transimpedance amplifier circuit illustrated in FIG. 13.

FIG. 15 shows the photo-diode receiver circuitry 34 and system power management circuitry 38 feeding the transimpedance amplifier circuit 20 illustrated in FIG. 13. The photo-diode receiver circuitry 34 and the transimpedance amplifier circuit 20 may be part of an optical receiver, which may be used in a fiber-optics based communications system. The photo-diode receiver circuitry 34 provides the positive-side and negative-side input signals $V_{INP}$, $V_{INN}$ to the transimpedance amplifier circuit 20 based on received optical signals. The system power management circuitry 38 provides the input side and output side steering signals $V_{STIN}$, $V_{STOUT}$ to the transimpedance amplifier circuit 20. The input side and output side steering signals $V_{STIN}$, $V_{STOUT}$ may be based on signal levels in one or more communications paths in the fiber-optics based communications system.

Figure 16:
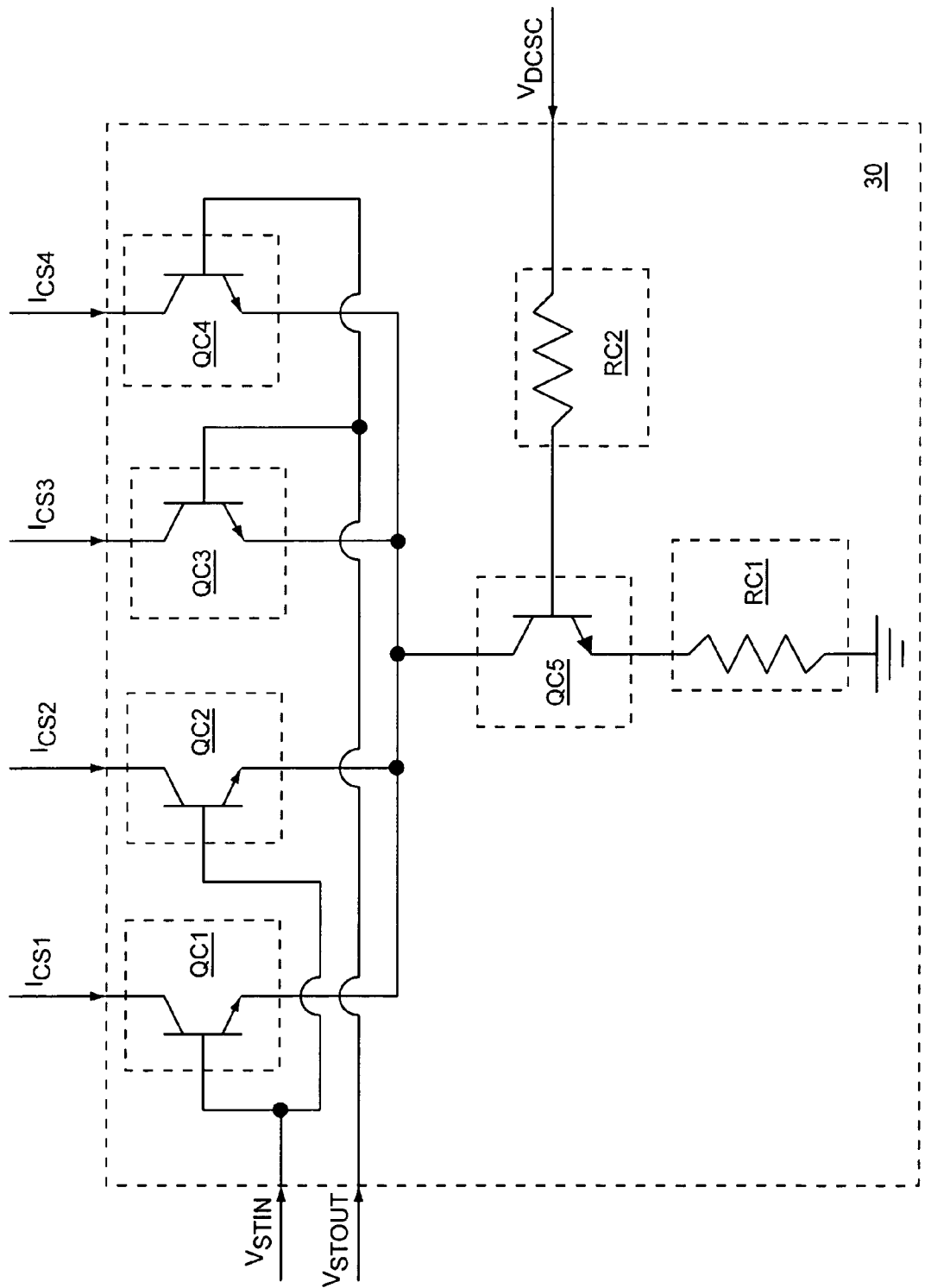
FIG. 16 shows details of the dynamic current sources illustrated in FIG. 13 according to an alternate embodiment of the dynamic current sources.

FIG. 16 shows details of the dynamic current sources 30 illustrated in FIG. 13 according to an alternate embodiment of the dynamic current sources 30. The dynamic current sources 30 include the first current source transistor element QC1, the second current source transistor element QC2, the third current source transistor element QC3, the fourth current source transistor element QC4, a fifth current source transistor element QC5, a first current source resistive element RC1, and a second current source resistive element RC2. The bases of the first and second current source transistor elements QC1, QC2 are coupled together and receive the input side steering signal $V_{STIN}$. The bases of the third and fourth current source transistor elements QC3, QC4 are coupled together and receive the output side steering signal $V_{STOUT}$.

The emitters of the first, second, third, and fourth current source transistor elements QC1, QC2, QC3, QC4 are coupled to a collector of the fifth current source transistor element QC5. The collectors of the first, second, third, and fourth current source transistor elements QC1, QC2, QC3, QC4 receive the first, second, third, and fourth current source currents $I_{CS1}$, $I_{CS2}$, $I_{CS3}$, $I_{CS4}$, respectively. The first current source resistive element RC1 is coupled between an emitter of the fifth current source transistor element QC5 and ground. In an alternate embodiment of the dynamic current sources 30, the first current source resistive element RC1 is coupled between the emitter of the fifth current source transistor element QC5 and a DC reference. One end of the second current source resistive element RC2 is coupled to a base of the fifth current source transistor element QC5, and the other end of the second current source resistive element RC2 receives the signal conditioned detector output signal $V_{DCSC}$.

A sum of the magnitudes of the first, second, third, and fourth current source currents $I_{CS1}$, $I_{CS2}$, $I_{CS3}$, $I_{CS4}$ is provided by a collector current of the fifth current source transistor element QC5, which may be based on the signal conditioned detector output signal $V_{DCSC}$. The first and second current source currents $I_{CS1}$, $I_{CS2}$ may be additionally controlled based on the input side steering signal $V_{STIN}$ and the third and fourth current source currents $I_{CS3}$, $I_{CS4}$ may be additionally controlled based on the output side steering signal $V_{STOUT}$. The first and second current source currents $I_{CS1}$, $I_{CS2}$ may be about equal to one another. The third and fourth current source currents $I_{CS3}$, $I_{CS4}$ may be about equal to one another.

Figure 17:
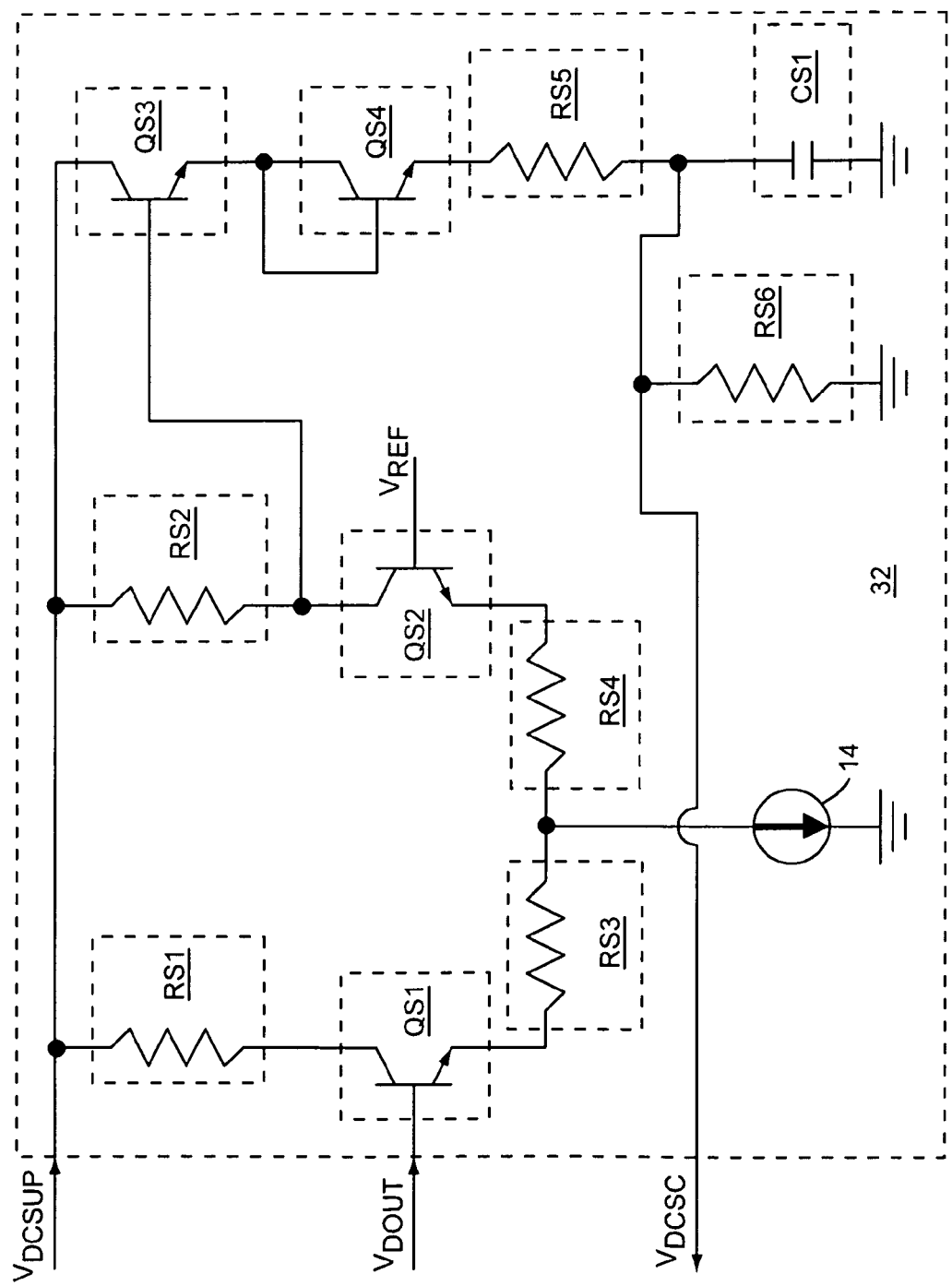
FIG. 17 shows details of signal conditioning circuitry illustrated in FIG. 13 according to one embodiment of the signal conditioning circuitry.

FIG. 17 shows details of the signal conditioning circuitry 32 illustrated in FIG. 13 according to one embodiment of the signal conditioning circuitry 32. The signal conditioning circuitry 32 includes a first signal conditioning transistor element QS1, a second signal conditioning transistor element QS2, a third signal conditioning transistor element QS3, a fourth signal conditioning transistor element QS4, a first signal conditioning resistive element RS1, a second signal conditioning resistive element RS2, a third signal conditioning resistive element RS3, a fourth signal conditioning resistive element RS4, a fifth signal conditioning resistive element RS5, a sixth signal conditioning resistive element RS6, a first signal conditioning capacitive element CS1, and the second current source 14.

A base of the first signal conditioning transistor element QS1 receives the detector output signal $V_{DOUT}$, and a base of the second signal conditioning transistor element QS2 receives a reference signal $V_{REF}$. The first signal conditioning resistive element RS1 is coupled between a collector of the first signal conditioning transistor element QS1 and a DC supply bus. The second signal conditioning resistive element RS2 is coupled between a collector of the second signal conditioning transistor element QS2 and the DC supply bus. The third signal conditioning resistive element RS3 is coupled between an emitter of the first signal conditioning transistor element QS1 and a first node. The fourth signal conditioning resistive element RS4 is coupled between an emitter of the second signal conditioning transistor element QS2 and the first node. The second current source 14 is coupled between the first node and ground. In an alternate embodiment of the signal conditioning circuitry 32, the second current source 14 is coupled between the first node and a DC reference.

A base of the third signal conditioning transistor element QS3 is coupled to the collector of the second signal conditioning transistor element QS2. A collector of the third signal conditioning transistor element QS3 is coupled to the DC supply bus. An emitter of the third signal conditioning transistor element QS3 is coupled to a collector and a base of the fourth signal conditioning transistor element QS4. A fifth signal conditioning resistive element RS5 is coupled between an emitter of the fourth signal conditioning transistor element QS4 and a second node. The sixth signal conditioning resistive element RS6 is coupled between the second node and ground, and the first signal conditioning capacitive element CS1 is coupled between the second node and ground. In another embodiment of the signal conditioning circuitry 32, the sixth signal conditioning resistive element RS6 is coupled between the second node and a DC reference, and the first signal conditioning capacitive element CS1 is coupled between the second node and a DC reference. The second node provides the signal conditioned detector output signal $V_{DCSC}$ and a DC supply signal $V_{DCSUP}$ feeds the DC supply bus.

The first and second signal conditioning transistor elements QS1, QS2, the first, second, third, and fourth signal conditioning resistive elements RS1, RS2, RS3, RS4, and the second current source 14 form a differential amplifier to receive and amplify the detector output signal $V_{DOUT}$. The third and fourth signal conditioning transistor elements QS3, QS4 form a level-shifting circuit to receive and level-shift the amplified detector output signal. The fifth and sixth signal conditioning resistive elements RS5, RS6 and the first signal conditioning capacitive element CS1 receive and filter the level-shifted amplified detector output signal to provide the signal conditioned detector output signal $V_{DCSC}$.

Figure 18:
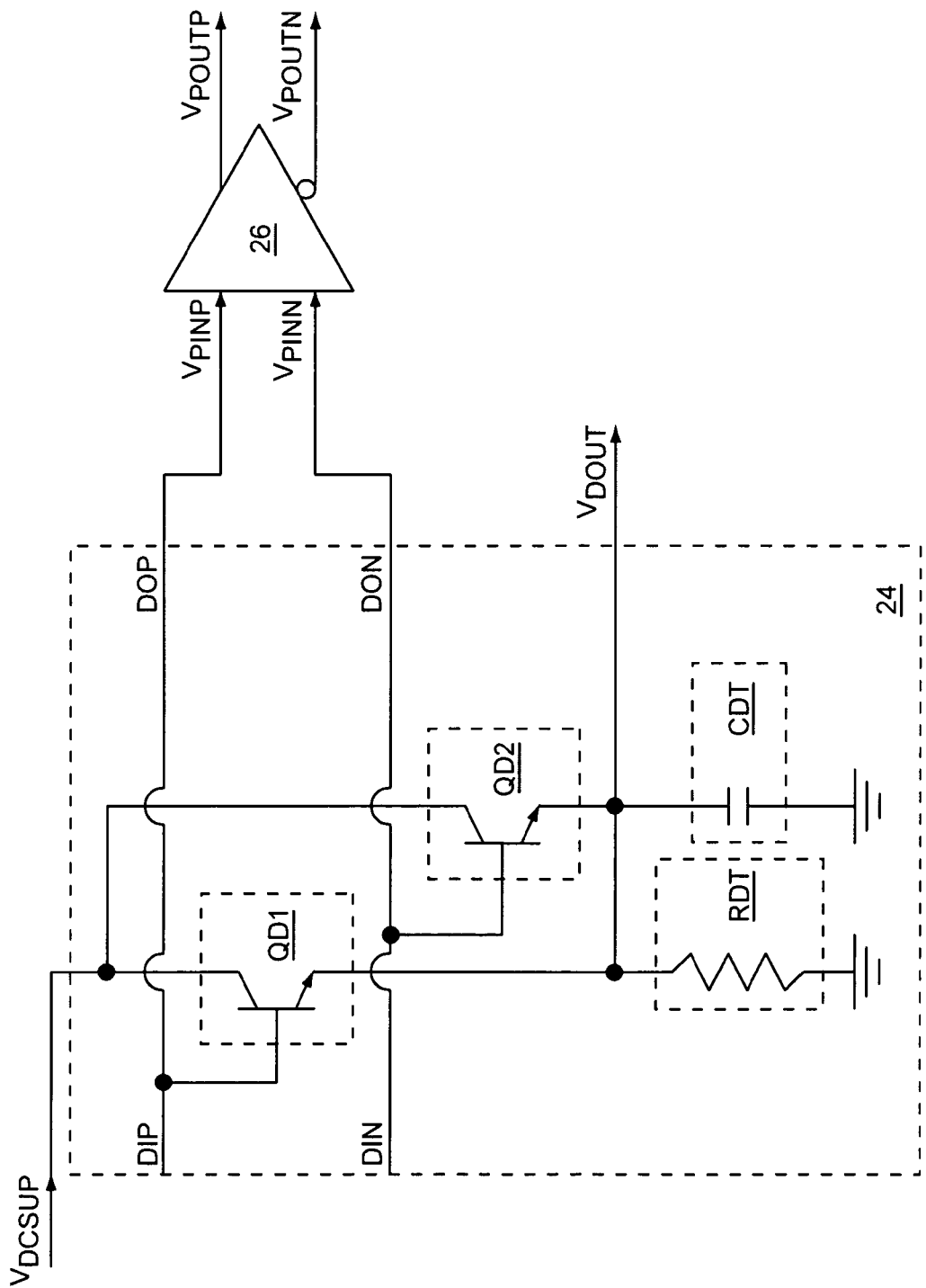
FIG. 18 shows details of a detector and a differential post amplifier illustrated in FIG. 13 according to one embodiment of the detector and the differential post amplifier.

FIG. 18 shows details of the detector 24 and the differential post amplifier 26 illustrated in FIG. 13 according to one embodiment of the detector 24 and the differential post amplifier 26. The detector 24 includes a first detector transistor element QD1, a second detector transistor element QD2, a detector resistive element RDT, and a detector capacitive element CDT. The positive-side and negative-side detector inputs DIP, DIN of the detector 24 are coupled to the positive-side and negative-side detector outputs DOP, DON, respectively. A base of the first detector transistor element QD1 is coupled to the positive-side detector input DIP, and a base of the second detector transistor element QD2 is coupled to the negative-side detector input DIN. A DC supply signal $V_{DCSUP}$ feeds collectors of the first and second detector transistor elements QD1, QD2. Emitters of the first and second detector transistor elements QD1, QD2 are coupled together and provide the detector output signal $V_{DOUT}$. The detector resistive element RDT is coupled between the emitters of the first and second detector transistor elements QD1, QD2 and ground, and the detector capacitive element CDT is coupled between the emitters of the first and second detector transistor elements QD1, QD2 and ground. In an alternate embodiment of the detector 24, the detector resistive element RDT is coupled between the emitters of the first and second detector transistor elements QD1, QD2 and a DC reference, and the detector capacitive element CDT is coupled between the emitters of the first and second detector transistor elements QD1, QD2 and the DC reference.

The detector 24 provides the detector output signal $V_{DOUT}$ based on half-wave rectification and low-pass filtering of signals at the positive-side and negative-side detector inputs DIP, DIN. Half-wave rectification is often used when photo-diodes provide input signals to the transimpedance amplifier circuit 20, since the signals provided by the photo-diodes may be half-wave signals. By using half-wave rectification and low-pass filtering as shown, the detector output signal $V_{DOUT}$ may be indicative of magnitudes of the signals from the photo-diodes substantially independent of the digital density of digital data encoded onto optical signals received by the photo-diodes.

Additional embodiments of the detector 24 may provide the detector output signal $V_{DOUT}$ based on full-wave rectification and low-pass filtering of signals at the positive-side and negative-side detector inputs DIP, DIN. The differential post amplifier 26 is shown as a differential amplifier having both differential inputs and differential outputs. The positive-side and negative-side detector outputs DOP, DON of the detector 24 provide the positive-side and negative-side post amplifier input signals $V_{PINP}$, $V_{PINN}$, respectively, to the differential post amplifier 26, which provides the positive-side and negative-side post amplifier output signals $V_{POUTP}$, $V_{POUTN}$ based on amplifying the positive-side and negative-side post amplifier input signals $V_{PINP}$, $V_{PINN}$, respectively.

The detector output signal $V_{DOUT}$ may be based on the positive-side transimpedance output signal $V_{TOUTP}$, the negative-side transimpedance output signal $V_{TOUTN}$, or both. The detector output signal $V_{DOUT}$ may be based on a peak value of the positive-side transimpedance output signal $V_{TOUTP}$, a peak value of the negative-side transimpedance output signal $V_{TOUTN}$, or both. The detector output signal $V_{DOUT}$ may be based on an average value of the positive-side transimpedance output signal $V_{TOUTP}$, an average value of the negative-side transimpedance output signal $V_{TOUTN}$, or both. The detector output signal $V_{DOUT}$ may be based on half-wave rectification of the positive-side transimpedance output signal $V_{TOUTP}$, half-wave rectification of the negative-side transimpedance output signal $V_{TOUTN}$, or both. The detector output signal $V_{DOUT}$ may be based on half-wave rectification and low-pass filtering of the positive-side transimpedance output signal $V_{TOUTP}$, half-wave rectification and low-pass filtering of the negative-side transimpedance output signal $V_{TOUTN}$, or both, such that the detector output signal $V_{DOUT}$ is substantially independent of digital density of data embedded in the positive-side and negative-side transimpedance output signals $V_{TOUTP}$, $V_{TOUTN}$.

In an alternate embodiment of the transimpedance amplifier circuit 20, the detector output signal $V_{DOUT}$ may be based on the positive-side input signal $V_{INP}$, the negative-side input signal $V_{INN}$, or both. The detector output signal $V_{DOUT}$ may be based on a peak value of the positive-side input signal $V_{INP}$, a peak value of the negative-side input signal $V_{INN}$, or both. The detector output signal $V_{DOUT}$ may be based on an average value of the positive-side input signal $V_{INP}$, an average value of the negative-side input signal $V_{INN}$, or both. The detector output signal $V_{DOUT}$ may be based on half-wave rectification of the positive-side input signal $V_{INP}$, half-wave rectification of the negative-side input signal $V_{INN}$, or both. The detector output signal $V_{DOUT}$ may be based on half-wave rectification and low-pass filtering of the positive-side input signal $V_{INP}$, half-wave rectification and low-pass filtering of the negative-side input signal $V_{INN}$, or both, such that the detector output signal $V_{DOUT}$ is substantially independent of digital density of data embedded in the positive-side and negative-side input signals $V_{INP}$, $V_{INN}$.

FIG. 19 is a simulation schematic showing the linearized differential transimpedance amplifier 22 and the differential post amplifier 26. The positive-side and negative-side transimpedance input signals $V_{TINP}$, $V_{TINN}$ feed the linearized differential transimpedance amplifier 22 and are associated with the positive-side and negative-side transimpedance input currents $I_{TINP}$, $I_{TINN}$, respectively. The linearized differential transimpedance amplifier 22 amplifies the positive-side and negative-side transimpedance input signals $V_{TINP}$, $V_{TINN}$ to provide the positive-side and negative-side transimpedance output signals $V_{TOUTP}$, $V_{TOUTN}$, which provide the positive-side and negative-side post amplifier input signals $V_{PINP}$, $V_{PINN}$ to the differential post amplifier 26. The differential post amplifier 26 amplifies the positive-side and negative-side post amplifier input signals $V_{PINP}$, $V_{PINN}$ to provide the positive-side and negative-side post amplifier output signals $V_{POUTP}$, $V_{POUTN}$.

FIGS. 20A, 20B, 20C, 20D, 20E, and 20F are graphs showing eye diagrams associated with simulations performed on the linearized differential transimpedance amplifier 22 and the differential post amplifier 26 illustrated in FIG. 19. FIGS. 20A, 20C, and 20E show simulation results without linearization, whereas FIGS. 20B, 20D, and 20F show simulation results with linearization. FIG. 20A shows an eye diagram of the positive-side and negative-side transimpedance input currents $I_{TINP}$, $I_{TINN}$, which are the signals that drive the simulations. FIG. 20B is about identical to FIG. 20A. The peak value of the positive-side and negative-side transimpedance input currents $I_{TINP}$, $I_{TINN}$ is about 3.5 milliamps, which is within the normal operating range of the linearized differential transimpedance amplifier 22. FIG. 20C shows an eye diagram of the positive-side and negative-side transimpedance output signals $V_{TOUTP}$, $V_{TOUTN}$ without linearization, and FIG. 20D shows an eye diagram of the positive-side and negative-side transimpedance output signals $V_{TOUTP}$, $V_{TOUTN}$ with linearization. While both eye diagrams of FIGS. 20C and 20D show acceptable performance, the eye diagram of FIG. 20D with linearization illustrates better signal margins. FIG. 20E shows an eye diagram of the positive-side and negative-side post amplifier output signals $V_{POUTP}$, $V_{POUTN}$ without linearization, and FIG. 20F shows an eye diagram of the positive-side and negative-side post amplifier output signals $V_{POUTP}$, $V_{POUTN}$ with linearization. While both eye diagrams of FIGS. 20E and 20F show acceptable performance, the eye diagram of FIG. 20F with linearization illustrates better signal margins.

FIGS. 21A, 21B, 21C, 21D, 21E, and 21F are graphs showing eye diagrams associated with simulations performed on the linearized differential transimpedance amplifier 22 and the differential post amplifier 26 illustrated in FIG. 19. FIGS. 21A, 21C, and 21E show simulation results without linearization, whereas FIGS. 21B, 21D, and 21F show simulation results with linearization. FIG. 21A shows an eye diagram of the positive-side and negative-side transimpedance input currents $I_{TINP}$, $I_{TINN}$, which are the signals that drive the simulations. FIG. 21B is about identical to FIG. 21A. The peak value of the positive-side and negative-side transimpedance input currents $I_{TINP}$, $I_{TINN}$ is about five milliamps, which exceeds the normal operating range of the linearized differential transimpedance amplifier 22 operating without linearization. FIG. 21C shows an eye diagram of the positive-side and negative-side transimpedance output signals $V_{TOUTP}$, $V_{TOUTN}$ without linearization, and FIG. 21D shows an eye diagram of the positive-side and negative-side transimpedance output signals $V_{TOUTP}$, $V_{TOUTN}$ with linearization.

Since the positive-side and negative-side transimpedance input currents $I_{TINP}$, $I_{TINN}$ exceed the normal operating range, the eye diagram of FIG. 21C, which is associated with no linearization, shows unacceptable performance. However, the eye diagram of FIG. 21D, which is associated with linearization, shows acceptable performance. Similarly, the eye diagram of FIG. 21E, which is associated with no linearization, shows unacceptable performance. However, the eye diagram of FIG. 21F, which is associated with linearization, shows acceptable performance. Therefore, one or more of the linearization techniques associated with the present invention may increase the operating range of the linearized differential transimpedance amplifier 22, may improve signal margins, or both.

Those skilled in the art will recognize improvements and modifications to the preferred embodiments of the present invention. All such improvements and modifications are considered within the scope of the concepts disclosed herein and the claims that follow.

What is claimed is:

1. A transimpedance amplifier circuit comprising:
   a linearized differential transimpedance amplifier comprising:
      an amplifier circuit having:
         a positive-side input, which is adapted to receive a positive-side transimpedance input signal based on a positive-side input signal; and
         a negative-side input, which is adapted to receive a negative-side transimpedance input signal based on a negative-side input signal;
      a first feedback resistor having a first input end coupled to the positive-side input and a first output end; and
      a second feedback resistor having a second input end coupled to the negative-side input and a second output end;
   a detector adapted to provide at least one detector output signal based on magnitudes of the positive-side and the negative-side input signals; and
   dynamic current source circuitry comprising:
      a first current source having a first current and coupled to the first output end, such that the first current is based on the at least one detector output signal; and a second current source having a second current and coupled to the second output end, such that the second current is based on the at least one detector output signal, wherein a magnitude of the first current is about equal to a magnitude of the second current and the linearized differential transimpedance amplifier is adapted to provide positive-side and negative-side transimpedance output signals based on amplifying a difference between the positive-side and the negative side transimpedance input signals.

2. The transimpedance amplifier circuit of claim 1 wherein the magnitudes of the first and the second currents are directly related to the magnitudes of the positive-side and the negative-side input signals, such that as the magnitudes of the positive-side and the negative-side input signals increase, the magnitudes of the first and the second currents increase, and as the magnitudes of the positive-side and the negative-side input signals decrease, the magnitudes of the first and the second currents decrease.

3. The transimpedance amplifier circuit of claim 2 wherein a magnitude of the at least one detector output signal is directly related to the magnitudes of the positive-side and the negative-side input signals, such that as the magnitudes of the positive-side and the negative-side input signals increase, the magnitude of the at least one detector output signal increases, and as the magnitudes of the positive-side and the negative-side input signals decrease, the magnitude of the at least one detector output signal decreases.

4. The transimpedance amplifier circuit of claim 2 wherein the magnitudes of the first and the second currents are directly related to a common mode magnitude of the positive-side and the negative-side input signals, such that as the common mode magnitude of the positive-side and the negative-side input signals increases, the magnitudes of the first and the second currents increase, and as the common mode magnitude of the positive-side and the negative-side input signals decrease, the magnitudes of the first and the second currents decrease.

5. The transimpedance amplifier circuit of claim 2 wherein the magnitudes of the first and the second currents are directly related to a difference between the magnitude of the positive-side input signal and the magnitude of the negative-side input signal, such that as the difference between the magnitude of the positive-side input signal and the magnitude of the negative-side input signal increases, the magnitudes of the first and the second currents increase, and as the difference between the magnitude of the positive-side input signal and the magnitude of the negative-side input signal decreases, the magnitudes of the first and the second currents decrease.

6. The transimpedance amplifier circuit of claim 1 wherein the dynamic current source circuitry further comprises:
   a third current source having a third current and coupled to the first input end of the first feedback resistor, such that the third current is based on the at least one detector output signal; and
   a fourth current source having a fourth current and coupled to the second input end of the second feedback resistor, such that the fourth current is based on the at least one detector output signal,
wherein a magnitude of the third current is about equal to a magnitude of the fourth current.

7. The transimpedance amplifier circuit of claim 6 wherein the magnitudes of the first current, the second current, the third current, and the fourth current are about equal to one another.

8. The transimpedance amplifier circuit of claim 6 wherein:
   the dynamic current source circuitry is adapted to receive at least one steering signal;
   the magnitudes of the first current and the second current are further based on the at least one steering signal; and
   the magnitudes of the third current and the fourth current are further based on the at least one steering signal.

9. The transimpedance amplifier circuit of claim 8 wherein:
   the magnitudes of the positive-side and the negative-side input signals are associated with an input signal range having a maximum magnitude, a midpoint magnitude, and a minimum magnitude;
   a first threshold is between the minimum magnitude and the midpoint magnitude;
   a second threshold is between the midpoint magnitude and the maximum magnitude;
   when magnitudes associated with the positive-side and the negative-side input signals are less than the first threshold, the magnitudes of the first current and the second current are greater than the magnitudes of the third current and the fourth current; and
   when the magnitudes associated with the positive-side and the negative-side input signals are greater than the second threshold, the magnitudes of the first current and the second current are less than the magnitudes of the third current and the fourth current.

10. The transimpedance amplifier circuit of claim 8 wherein the at least one steering signal is based on at least one of maximizing a signal-to-noise ratio, maximizing signal clarity, and minimizing a bit-error-rate.

11. The transimpedance amplifier circuit of claim 1 wherein:
   the positive-side transimpedance input signal has a positive-side transimpedance input current; and
   the negative-side transimpedance input signal has a negative-side transimpedance input current,
wherein the difference between the positive-side transimpedance input signal and the negative-side transimpedance input signal is based on a difference between the positive-side transimpedance input current and the negative-side transimpedance input current.

12. The transimpedance amplifier circuit of claim 1 wherein:
   the positive-side input signal provides the positive-side transimpedance input signal and the negative-side input signal provides the negative-side transimpedance input signal;
   the detector is further adapted to receive the positive-side and the negative-side transimpedance output signals; and
   the at least one detector output signal is further based on at least one of the positive-side transimpedance output signal and the negative-side transimpedance output signal.

13. The transimpedance amplifier circuit of claim 12 wherein the at least one detector output signal is further based on at least one of a peak value of the positive-side transimpedance output signal and a peak value of the negative-side transimpedance output signal.

14. The transimpedance amplifier circuit of claim 12 wherein the at least one detector output signal is further based on at least one of an average value of the positive-side transimpedance output signal and an average value of the negative-side transimpedance output signal.

15. The transimpedance amplifier circuit of claim 12 wherein the at least one detector output signal is further based on at least one of half-wave rectification of the positive-side transimpedance output signal and half-wave rectification of the negative-side transimpedance output signal.

16. The transimpedance amplifier circuit of claim 12 wherein the at least one detector output signal is further based on at least one of half-wave rectification and low-pass filtering of the positive-side transimpedance output signal and half-wave rectification and low-pass filtering of the negative-side transimpedance output signal, such that the at least one detector output signal is substantially independent of digital density of data embedded in the positive-side and the negative-side transimpedance output signals.

17. The transimpedance amplifier circuit of claim 12 wherein:
   the linearized differential transimpedance amplifier is a pre-amplifier;
   the transimpedance amplifier circuit further comprises a differential post amplifier adapted to:
      receive the positive-side and the negative-side transimpedance output signals; and
      provide positive-side and negative-side post amplifier output signals based on the positive-side and the negative-side transimpedance output signals; and
   the detector is further adapted to:
      receive the positive-side and the negative-side post amplifier output signals;
      provide positive-side and negative-side output signals based on the positive-side and the negative-side post amplifier output signals; and
      provide the at least one detector output signal further based on at least one of the positive-side post amplifier output signal and the negative-side post amplifier output signal.

18. The transimpedance amplifier circuit of claim 12 wherein:
   the linearized differential transimpedance amplifier is a pre-amplifier;
   the transimpedance amplifier circuit further comprises a differential post amplifier adapted to:
      receive positive-side and negative-side post amplifier input signals; and
      provide positive-side and negative-side post amplifier output signals based on the positive-side and the negative-side post amplifier input signals; and
   the detector is further adapted to provide the positive-side and the negative-side post amplifier input signals based on the positive-side and the negative-side transimpedance output signals.

19. The transimpedance amplifier circuit of claim 1 wherein:
   the detector is further adapted to receive the positive-side and the negative-side input signals and provide the positive-side and the negative-side transimpedance input signals based on the positive-side and the negative-side input signals; and
   the at least one detector output signal is further based on at least one of the positive-side input signal and the negative-side input signal.

20. A method comprising:
   providing a linearized differential transimpedance amplifier having:
      an amplifier circuit having a positive-side input and a negative-side input;
      a first feedback resistor having a first input end coupled to the positive-side input and a first output end; and
      a second feedback resistor having a second input end coupled to the negative-side input and a second output end;
   using the positive-side input to receive a positive-side transimpedance input signal;
   using the negative-side input to receive a negative-side transimpedance input signal;
   providing at least one detector output signal based on magnitudes of the positive-side and the negative-side transimpedance input signals;
   providing a first current source having a first current and coupled to the first output end;
   providing a second current source having a second current and coupled to the first output end;
   controlling the first current based on the at least one detector output signal;
   controlling the second current based on the at least one detector output signal; and
   amplifying a difference between the positive-side transimpedance input signal and the negative-side transimpedance input signal to provide a positive-side transimpedance output signal and a negative-side transimpedance output signal,
wherein a magnitude of the first current is about equal to a magnitude of the second current.

* * * * *